US012604648B2

(12) United States Patent
Lee et al.

(10) Patent No.: US 12,604,648 B2
(45) Date of Patent: Apr. 14, 2026

(54) DISPLAY DEVICE, METHOD OF MANUFACTURING THE SAME, AND TILED DISPLAY DEVICE

(71) Applicant: Samsung Display Co., LTD., Yongin-si (KR)

(72) Inventors: Dong Sung Lee, Yongin-si (KR); Byung Hoon Kim, Yongin-si (KR); Tae Oh Kim, Yongin-si (KR); Se Hun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 18/358,181

(22) Filed: Jul. 25, 2023

(65) Prior Publication Data

US 2024/0155926 A1     May 9, 2024

(30) Foreign Application Priority Data

Nov. 3, 2022     (KR) ........................ 10-2022-0145337

(51) Int. Cl.
*H10K 59/80* (2023.01)
*H10K 59/12* (2023.01)
(Continued)

(52) U.S. Cl.
CPC ..... *H10K 59/8792* (2023.02); *H10K 59/1201* (2023.02); *H10K 59/131* (2023.02); *H10K 59/18* (2023.02)

(58) Field of Classification Search
CPC ........... H10K 59/8792; H10K 59/1201; H10K 59/131; H10K 59/18; G09F 9/3023;
(Continued)

(56) References Cited

U.S. PATENT DOCUMENTS

2022/0052078 A1     2/2022   Kim et al.
2022/0285428 A1     9/2022   Jo et al.
(Continued)

FOREIGN PATENT DOCUMENTS

CN      114040590      2/2022
CN      114927060      8/2022
(Continued)

OTHER PUBLICATIONS

Extended European Search Report for European Application No. 23203442.1, dated Apr. 3, 2024.

*Primary Examiner* — Norman D Richards
*Assistant Examiner* — Laura M Dykes
(74) *Attorney, Agent, or Firm* — Womble Bond Dickinson (US) LLP

(57) ABSTRACT

A display device of a tiled display includes a first substrate including an opening hole, a laser absorption layer disposed on the first substrate, including amorphous silicon, and multiple first contact holes, a first barrier insulating layer disposed on the laser absorption layer and including multiple second contact holes overlapping the first contact holes, multiple pad portions disposed on the first barrier insulating layer and partially disposed in the second contact holes, a second barrier insulating layer disposed on the first barrier insulating layer and the pad portions, a display layer disposed on the second barrier insulating layer, and a flexible film disposed under the first substrate, inserted into the opening hole, and electrically connected to the pad portions. A portion of the first barrier insulating layer is disposed in each of the first contact holes. The pad portions are electrically insulated from the laser absorption layer.

20 Claims, 28 Drawing Sheets

(51) Int. Cl.
    *H10K 59/131*        (2023.01)
    *H10K 59/18*         (2023.01)

(58) Field of Classification Search
    CPC ..... G09F 9/3026; H05K 1/111; H10D 86/411;
                                  H10D 86/451
    USPC ......................................................... 257/40
    See application file for complete search history.

(56)               References Cited

U.S. PATENT DOCUMENTS

| | | | |
|---|---|---|---|
| 2023/0136160 A1* | 5/2023 | Zhu ...................... | H10D 86/411 |
| | | | 257/79 |
| 2023/0187582 A1 | 6/2023 | Noh et al. | |
| 2023/0216010 A1 | 7/2023 | Jiang et al. | |
| 2023/0315376 A1* | 10/2023 | Lee ...................... | G06F 3/1446 |
| | | | 345/1.3 |

FOREIGN PATENT DOCUMENTS

| | | |
|---|---|---|
| CN | 115280497 | 11/2022 |
| JP | 2017-151257 | 8/2017 |
| KR | 10-2200258 | 1/2021 |
| KR | 10-2023-0140658 | 10/2023 |

\* cited by examiner

10: 10-1, 10-2, 10-3, 10-4

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2
CNT: CNT1, CNT2, CNT3

SP: SP1, SP2, SP3

LAL
SUB1
CG1

Z
Y

MTL1: FOL

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DISPLAY DEVICE, METHOD OF MANUFACTURING THE SAME, AND TILED DISPLAY DEVICE

CROSS-REFERENCE TO RELATED APPLICATION(S)

This application claims priority to and benefits of Korean Patent Application No. 10-2022-0145337 under 35 U.S.C. § 119, filed on Nov. 3, 2022 in the Korean Intellectual Property Office, the entire contents of which are incorporated herein by reference.

BACKGROUND

1. Technical Field

The disclosure relates to a display device, a method of manufacturing the display device, and a tiled display device including the display device.

2. Description of the Related Art

As information society develops, demands for display devices for displaying images are increasing in various forms. For example, display devices may be applied to various electronic devices such as smartphones, digital cameras, notebook computers, navigation devices, and smart televisions. Display devices may be flat panel display devices such as liquid crystal display devices, field emission display devices, and organic light emitting display devices. Of the flat panel display devices, a light emitting display device may include a light emitting element that enables each pixel of a display panel to emit light by itself. Thus, the light emitting display device can display an image without a backlight unit that provides light to the display panel.

In case that a display device is manufactured to have a large size, a defect rate of light emitting elements may increase due to an increase in the number of pixels, and productivity or reliability may be reduced. To solve these problems, a tiled display device may be implemented to provide a large screen by connecting multiple relatively small display devices. The tiled display device may include a boundary portion called a seam between the display devices due to a non-display area or a bezel area of each of the display devices adjacent to each other. In case that an image is displayed on the entire tiled display, the boundary portion between the display devices may give a sense of separation to the entire screen, thereby reducing the degree of immersion in the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of preventing damage to an upper substrate or a display layer in an etching process of a lower substrate, a method of manufacturing the display device, and a tiled display device including the display device.

Aspects of the disclosure also provide a display device capable of eliminating a sense of separation between multiple display devices and improving the degree of immersion in images by preventing a boundary portion or a non-display area between the display devices from being recognized, a method of manufacturing the display device, and a tiled display device including the display device.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first substrate including an opening hole, a laser absorption layer disposed on the first substrate, the laser absorption layer including amorphous silicon, and a plurality of first contact holes, a first barrier insulating layer disposed on the laser absorption layer and including a plurality of second contact holes overlapping the plurality of first contact holes, a plurality of pad portions disposed on the first barrier insulating layer and partially disposed in the plurality of second contact holes, a second barrier insulating layer disposed on the first barrier insulating layer and the plurality of pad portions, a display layer disposed on the second barrier insulating layer, and a flexible film disposed under the first substrate, inserted into the opening hole, and electrically connected to the plurality of pad portions. A portion of the first barrier insulating layer may be disposed in each of the plurality of first contact holes. The plurality of pad portions may be electrically insulated from the laser absorption layer.

The plurality of pad portions may not directly contact the laser absorption layer.

The portion of the first barrier insulating layer which is disposed in each of the plurality of first contact holes may partially protrude from a lower surface of the laser absorption layer.

Each of the plurality of pad portions may include a body portion disposed in a corresponding one of the plurality of second contact holes of the first barrier insulating layer and an extension portion disposed on both sides of the body portion and on the first barrier insulating layer, and at least a portion of the laser absorption layer may overlap each of the plurality of pad portions.

A width of each of the plurality of first contact holes of the laser absorption layer may be smaller than a maximum width of each of the plurality of pad portions and greater than a width of a lower end of the body portion of each of the plurality of pad portions.

The width of each of the plurality of first contact holes of the laser absorption layer may be in the range of about 15 μm to about 21 μm.

A thickness of the laser absorption layer may be in the range of about 300 Å to about 1000 Å.

The thickness of the laser absorption layer may be less than a thickness of the first barrier insulating layer.

The laser absorption layer may have a transmittance of about 10% or less for light having a wavelength in a range of about 300 nm to about 400 nm.

A portion of the laser absorption layer may be crystallized to comprise polysilicon.

The display device may further include a second substrate disposed between the second barrier insulating layer and the display layer, and a third barrier insulating layer disposed between the second substrate and the display layer. The display layer may include a plurality of connection portions disposed on the third barrier insulating layer and electrically connected to the plurality of pad portions, a plurality of data lines disposed on the third barrier insulating layer and extending in a first direction, and a plurality of high potential lines disposed on the third barrier insulating layer and extending in the first direction.

The plurality of pad portions may supply data voltages to the data lines through the connection portions and may supply high potential voltages to the high potential lines through the connection portions.

The display layer may further include a buffer layer disposed on the connection portions, thin-film transistors, each including an active layer disposed on the buffer layer, and a connection electrode disposed on the active layer, wherein an end of the connection electrode may be electrically connected to each of the high potential lines, and another end of the connection electrode may be electrically connected to each of the thin-film transistors.

The display layer may further include a light emitting element layer disposed on the connection electrode. The light emitting element layer may include a first electrode electrically connected to the connection electrode, a second electrode, the second electrode and the first electrode disposed on a same layer, and a light emitting element disposed on the first electrode and the second electrode and electrically connected to the first electrode and the second electrode.

According to an embodiment of the disclosure, a method of manufacturing a display device may include forming a laser absorption layer which includes amorphous silicon, on a first substrate, forming a plurality of first contact holes penetrating the laser absorption layer, forming a first barrier insulating layer on the laser absorption layer, forming a plurality of second contact holes penetrating the first barrier insulating layer and overlapping the plurality of first contact holes, forming a plurality of pad portions disposed on the first barrier insulating layer and inserted into the plurality of second contact holes, forming a second barrier insulating layer on the first barrier insulating layer and the plurality of pad portions, forming a display layer on the second barrier insulating layer, forming an opening hole by etching the first substrate and exposing the plurality of pad portions and a portion of the laser absorption layer, and electrically connecting a flexible film to each of the plurality of pad portions by inserting the flexible film into the opening hole. A portion of the first barrier insulating layer is disposed in each of the plurality of first contact holes. The plurality of pad portions may be electrically insulated from the laser absorption layer.

The exposing of the portion of the laser absorption layer and the plurality of pad portions may include irradiating laser light having a wavelength in a range of about 300 nm to about 400 nm to the first substrate, and a portion of the laser absorption layer may be crystallized to include polysilicon.

The plurality of pad portions may not directly contact the laser absorption layer.

The portion of the first barrier insulating layer which is disposed in each of the plurality of first contact holes may partially protrude from a lower surface of the laser absorption layer.

Each of the plurality of pad portions may include a body portion disposed in a corresponding one of the plurality of second contact holes of the first barrier insulating layer and an extension portion disposed on both sides of the body portion and on the first barrier insulating layer, and at least a portion of the laser absorption layer may overlap each of the plurality of pad portions.

According to an embodiment of the disclosure, a tiled display device may include a plurality of display devices, each including a display area having a plurality of pixels, and a non-display area surrounding the display area, and a coupling member coupling the plurality of display devices. At least one of the plurality of display devices may include a substrate including an opening hole, a laser absorption layer disposed on the substrate, including amorphous silicon, and a plurality of first contact holes, a first barrier insulating layer disposed on the laser absorption layer and including a plurality of second contact holes overlapping the plurality of first contact holes, a plurality of pad portions disposed on the first barrier insulating layer and partially disposed in the plurality of second contact holes, a second barrier insulating layer disposed on the first barrier insulating layer and the plurality of pad portions, a display layer disposed on the second barrier insulating layer, and a flexible film disposed under the substrate, inserted into the opening hole, and electrically connected to the plurality of pad portions. A portion of the first barrier insulating layer may be disposed in each of the plurality of first contact holes. The plurality of pad portions may be electrically insulated from the laser absorption layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
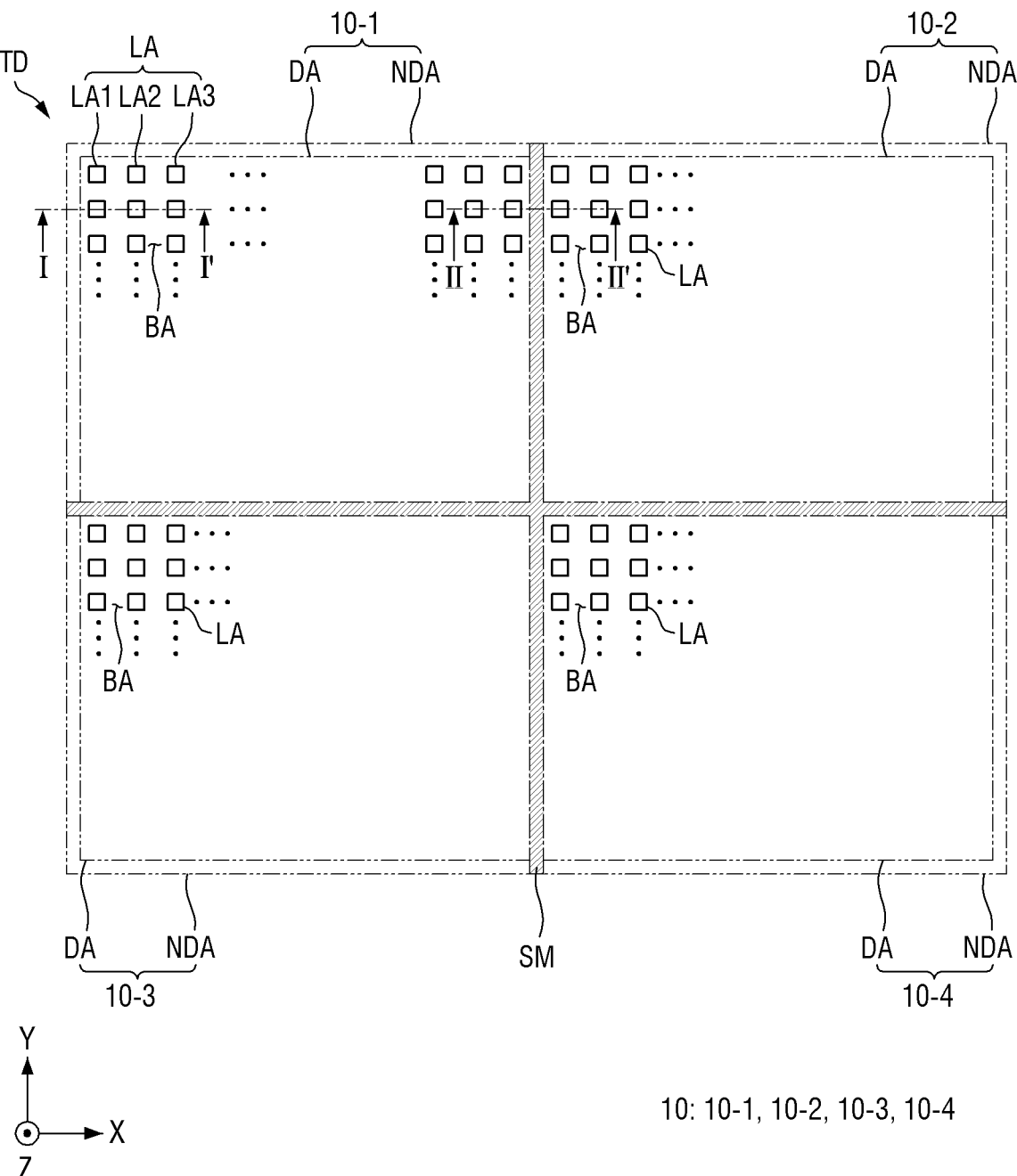
FIG. 1 is a schematic plan view of a tiled display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

It will also be understood that when a layer is referred to as being "on" another layer or substrate, it can be directly on the other layer or substrate, or intervening layers may also be present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The term "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that the terms "connected to" or "coupled to" may include a physical and/or electrical connection or coupling.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a tiled display device TD according to an embodiment.

Referring to FIG. 1, the tiled display device TD may include multiple display devices 10. The display devices 10 may be arranged in a lattice shape, but the disclosure is not limited thereto. The display devices 10 may be connected to each other in a first direction (X-axis direction) or a second direction (Y-axis direction), and the tiled display device TD may have a specific shape. For example, the display devices 10 may have the same size, but the disclosure is not limited thereto. For example, the display devices 10 may have different sizes.

The tiled display device TD may include first through fourth display devices 10-1 through 10-4. The number and coupling relationship of the display devices 10 are not limited to the embodiment of FIG. 1. The number of display devices 10 may be determined by the size of each of the display devices 10 and the tiled display device TD.

Each of the display devices 10 may be shaped like a rectangle including long sides and short sides. The long sides or short sides of the display devices 10 may be connected to each other. Some of the display devices 10 may be disposed at an edge of the tiled display device TD to form a side of the tiled display device TD. Some other ones of the display devices 10 may be disposed at corners of the tiled display device TD and may form two adjacent sides of the tiled display device TD. Yet other ones of the display devices 10 may be disposed inside the tiled display device TD and surrounded by other display devices 10.

Each of the display devices 10 may include a display area DA and a non-display area NDA. The display area DA may include pixels to display an image. Each of the pixels may include an organic light emitting diode including an organic light emitting layer, a quantum dot light emitting diode including a quantum dot light emitting layer, a micro light emitting diode, and/or an inorganic light emitting diode including an inorganic semiconductor. A case where each of the pixels includes an inorganic light emitting diode will be described below, but the disclosure is not limited to this case. The non-display area NDA may be disposed around the display area DA to surround the display area DA and may not display an image.

Each of the display devices 10 may include pixels arranged along rows and columns in the display area DA. Each of the pixels may include a light emitting area LA defined by a pixel defining layer or a bank and may emit light having a predetermined or selected peak wavelength through the light emitting area LA. For example, the display area DA of each of the display devices 10 may include first through third light emitting areas LA1 through LA3. Each of the first through third light emitting areas LA1 through LA3 may be an area where light generated by a light emitting element of a display device 10 is emitted to the outside of the display device 10.

Each of the first through third light emitting areas LA1 through LA3 may emit light having a predetermined or selected peak wavelength to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength of about 610 nm to 650 nm, the light of the second color may be green light having a peak wavelength of about 510 nm to 550 nm, and the light of the third color may be blue light having a peak wavelength of about 440 nm to 480 nm. However, the disclosure is not limited thereto.

The first through third light emitting areas LA1 through LA3 may be sequentially and repeatedly arranged along the first direction (X-axis direction) of the display area DA. The first through third light emitting areas LA1 through LA3 may be of different size or the same size. For example, the area of the third light emitting area LA3 may be larger than the area of the first light emitting area LA1, and the area of the first light emitting area LA1 may be larger than the area of the second light emitting area LA2, but the disclosure is not limited thereto. As another example, the area of the first light emitting area LA1, the area of the second light emitting area LA2, and the area of the third light emitting area LA3 may be substantially equal.

The display area DA of each display device 10 may include a light blocking area BA surrounding the light emitting areas LA. The light blocking area BA may prevent color mixing of light emitted from the first through third light emitting areas LA1 through LA3.

The overall shape of the tiled display device TD may be a plane shape, but the disclosure is not limited thereto. The tiled display device TD may also have a three-dimensional (3D) shape to provide a 3D effect to a user. For example, in case that the tiled display device TD has a 3D shape, at least some of the display devices 10 may have a curved shape. As another example, the display devices 10 may each have a plane shape but may be connected to each other at a predetermined or selected angle so that the tiled display device TD can have a 3D shape.

The tiled display device TD may include a coupling area SM disposed between multiple display areas DA. The tiled display device TD may be formed by connecting the non-display areas NDA of adjacent display devices 10. The display devices 10 may be connected to each other through a coupling member or an adhesive member disposed in the coupling area SM. The coupling area SM may not include a pad portion or a flexible film attached to the pad portion. Therefore, a distance between the respective display areas DA of the display devices 10 may be small enough to make the coupling area SM unrecognizable by a user. External light reflectance of the display area DA of each of the display devices 10 and external light reflectance of the coupling area SM may be substantially equal. Therefore, the tiled display device TD may eliminate a sense of separation between the display devices 10 and improve the degree of immersion in images by preventing the coupling area SM between the display devices 10 from being recognized by a user.

Figure 2:
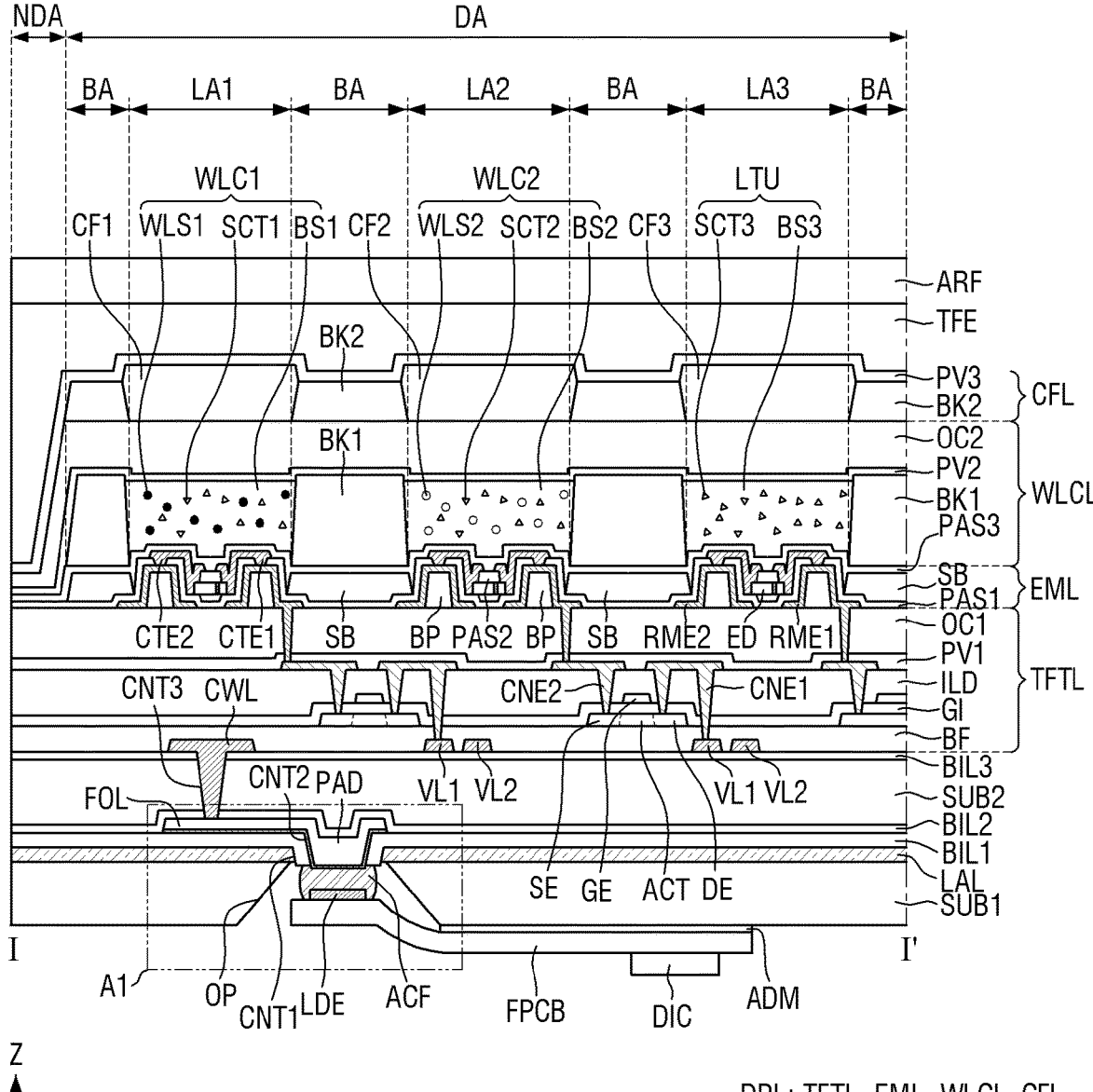
FIG. 2 is a schematic cross-sectional view taken along line I-I' of FIG. 1.
Figure 3:
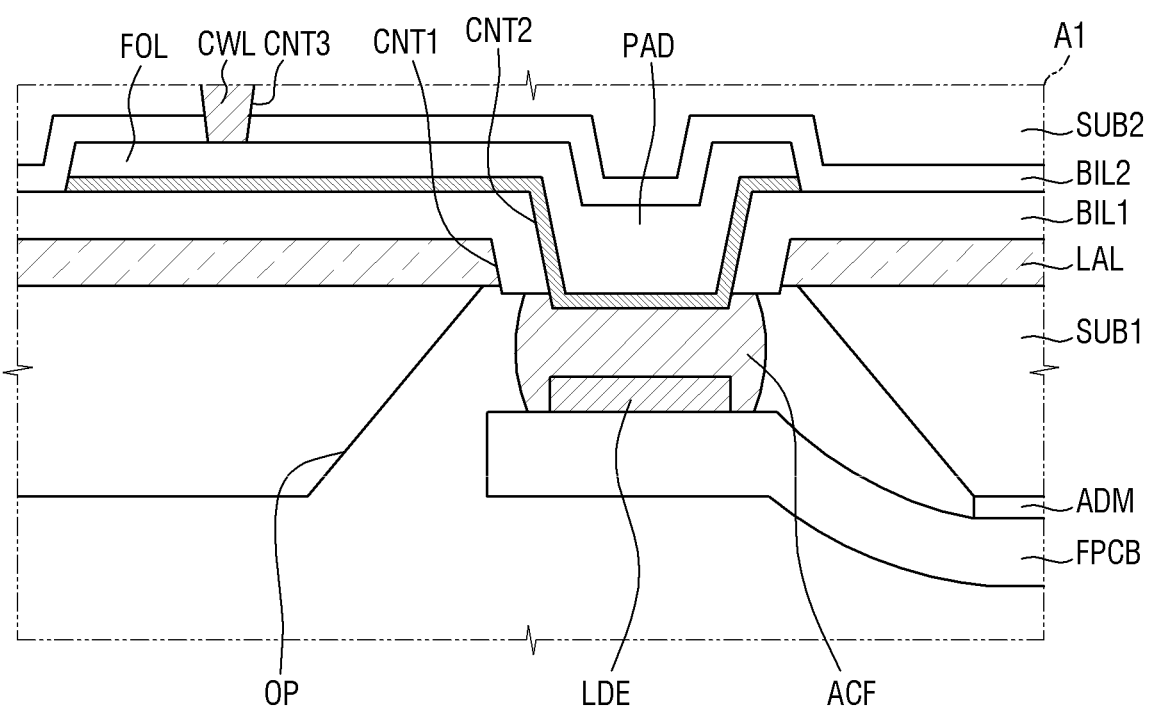
FIG. 3 is an enlarged schematic view of area A1 of FIG. 2.

FIG. 2 is a schematic cross-sectional view taken along line I-I' of FIG. 1. FIG. 3 is an enlarged schematic view of area A1 of FIG. 2.

Referring to FIGS. 2 and 3, the display area DA of a display device 10 may include the first through third light emitting areas LA1 through LA3. Each of the first through third light emitting areas LA1 through LA3 may be an area where light generated by a light emitting element ED of the display device 10 is emitted to the outside of the display device 10.

The display device 10 may include a first substrate SUB1, a laser absorption layer LAL, a first barrier insulating layer BIL1, a first metal layer MTL1, a second barrier insulating layer BIL2, a second substrate SUB2, a third barrier insulating layer BIL3, a display layer DPL, an encapsulation layer TFE, an anti-reflection layer ARF, a flexible film FPCB, and a display driver DIC.

The first substrate SUB1 may support the display device 10. The first substrate SUB1 may be a base substrate or a base member. The first substrate SUB1 may be a flexible substrate that can be bent, folded, or rolled. For example, the first substrate SUB1 may include, but is not limited to, an insulating material such as polymer resin (e.g., polyimide (PI)). As another example, the first substrate SUB1 may be a rigid substrate including a glass material.

The first substrate SUB1 may include an opening hole OP. The opening hole OP may be etched from a lower surface of the first substrate SUB1 through to an upper surface of the first substrate SUB1. For example, a lower width of the opening hole OP may be greater than an upper width of the opening hole OP. In a manufacturing process of the display device 10, a pad portion PAD inserted into a contact hole CNT may be exposed by the opening hole OP and may be electrically connected to a lead electrode LDE of the flexible film FPCB through a connection film ACF inserted into the opening hole OP.

The laser absorption layer LAL may be disposed on the first substrate SUB1. The laser absorption layer LAL may prevent transmission of ultraviolet (UV) laser light by absorbing the UV laser light in an etching process of the first substrate SUB1. Here, the UV laser light may have a wavelength of about 300 nm to about 400 nm, in another embodiment, about 340 nm to about 350 nm. The laser absorption layer LAL may prevent damage to the second substrate SUB2 or the display layer DPL by absorbing the UV laser light in the etching process of the first substrate SUB1. For example, the laser absorption layer LAL may include amorphous silicon (a-Si). The laser absorption layer LAL may have a thickness of about 300 Å to about 1000 Å, in another embodiment, about 500 Å. A thickness of the laser absorption layer LAL may be smaller than a thickness of the first or second barrier insulating layer BIL1 or BIL2. The thickness of the laser absorption layer LAL may be smaller than a thickness of a fan-out line FOL.

The first barrier insulating layer BIL1 may be disposed on the laser absorption layer LAL. The first barrier insulating layer BIL1 may include an inorganic layer that can prevent penetration of air or moisture. The first barrier insulating layer BIL1 may include at least one of a silicon nitride layer, a silicon oxynitride layer, a silicon oxide layer, a titanium oxide layer, an aluminum oxide layer, and an amorphous silicon layer. For example, the first barrier insulating layer BIL1 may include amorphous silicon (a-Si) having a thickness of about 50 Å or less and silicon oxide (SiOx) having a thickness of about 3000 Å or more. However, the disclosure is not limited thereto.

The laser absorption layer LAL and the first barrier insulating layer BIL1 may include contact holes CNT1 and CNT2 overlapping each other. For example, the laser absorption layer LAL may include a first contact hole CNT1, and the first barrier insulating layer BIL1 may include a second contact hole CNT2 overlapping the first contact hole CNT1. A portion of the first barrier insulating layer BIL1 may be disposed in the first contact hole CNT1, and the second contact hole CNT2 may penetrate the first barrier insulating layer BIL1 within the first contact hole CNTL. In an embodiment, a width of the first contact hole CNT1 may be greater than a width of the second contact hole CNT2.

The first metal layer MTL1 may be disposed on the first barrier insulating layer BIL1. The first metal layer MTL1 may include the fan-out line FOL. The first metal layer MTL1 may be a single layer or a multilayer made of at least one of molybdenum (Mo), aluminum (Al), chromium (Cr), gold (Au), silver (Ag), titanium (Ti), nickel (Ni), palladium (Pd), indium (In), neodymium (Nd), copper (Cu), and alloys thereof.

The pad portion PAD may be integrally formed with the fan-out line FOL and inserted into the first contact hole CNT1 and the second contact hole CNT2. The pad portion PAD may electrically connect the flexible film FPCB and a connection portion CWL. The pad portion PAD may be exposed by the opening hole OP of the first substrate SUB1. The pad portion PAD may be electrically connected to the lead electrode LDE of the flexible film FPCB through the connection film ACF. The fan-out line FOL may be electrically connected to a data line, a power line, or a gate line through the connection portion CWL. The data line or the power line may be connected to a drain electrode DE of a thin-film transistor TFT. The gate line may be connected to a gate electrode GE of the thin-film transistor TFT. Therefore, the fan-out line FOL may supply a data voltage, a power supply voltage, or a gate signal received from the display driver DIC of the flexible film FPCB to the thin-film transistor TFT of a pixel through the connection portion CWL. The display device 10 may minimize the area of the non-display area NDA by including the fan-out line FOL disposed in the display area DA.

Each of the pad portion PAD and the first metal layer MTL1 may be a single layer or a multilayer made of at least one of molybdenum (Mo), aluminum (Al), chromium (Cr), gold (Au), silver (Ag), titanium (Ti), nickel (Ni), palladium (Pd), indium (In), neodymium (Nd), copper (Cu), and alloys thereof. In an embodiment, each of the pad portion PAD and the first metal layer MTL1 may include a lower metal layer PL1 including titanium (Ti) and an upper metal layer PL2 disposed on the lower metal layer PL1 and including copper (Cu). However, the disclosure is not limited thereto.

The pad portion PAD may absorb UV laser light in an area in which the laser absorption layer LAL is not disposed and may prevent damage to the second substrate SUB2 or the display layer DPL in the etching process of the first substrate SUB1. Therefore, the display device 10 including the laser absorption layer LAL and the pad portion PAD can prevent damage to the second substrate SUB2 or the display layer DPL in the etching process of the first substrate SUB1.

The second barrier insulating layer BIL2 may be disposed on the first barrier insulating layer BIL1 and the first metal layer MTL1. The second barrier insulating layer BIL2 may include an inorganic layer that can prevent penetration of air or moisture. The second barrier insulating layer BIL2 may include at least one of a silicon nitride layer, a silicon oxynitride layer, a silicon oxide layer, a titanium oxide layer, an aluminum oxide layer, and an amorphous silicon layer. For example, the second barrier insulating layer BIL2 may include silicon nitride (SiNx) having a thickness of about 500 Å or less and silicon oxynitride (SiON) having a thickness of about 1500 Å or more. However, the disclosure is not limited thereto.

The second substrate SUB2 may be disposed on the second barrier insulating layer BIL2. The second substrate SUB2 may be a base substrate or a base member. The second substrate SUB2 may be a flexible substrate that can be bent, folded, and/or rolled. For example, the second substrate SUB2 may include, but is not limited to, an insulating material such as polymer resin (e.g., polyimide (PI)).

The third barrier insulating layer BIL3 may be disposed on the second substrate SUB2. The third barrier insulating layer BIL3 may include an inorganic layer that can prevent penetration of air or moisture. For example, the third barrier insulating layer BIL3 may include, but is not limited to, at least one of a silicon nitride layer, a silicon oxynitride layer, a silicon oxide layer, a titanium oxide layer, an aluminum oxide layer, and an amorphous silicon layer.

The third barrier insulating layer BIL3, the second substrate SUB2, and the second barrier insulating layer BIL2 may include a third contact hole CNT3. The third contact hole CNT3 may be etched from an upper surface of the third barrier insulating layer BIL3 through to a lower surface of the second barrier insulating layer BIL2. For example, an upper width of the third contact hole CNT3 may be greater than a lower width of the third contact hole CNT3. In the manufacturing process of the display device 10, an upper surface of the fan-out line FOL may be exposed by the third contact hole CNT3, and the fan-out line FOL may contact the connection portion CWL inserted into the third contact hole CNT3.

The display layer DPL may be disposed on the third barrier insulating layer BIL3. The display layer DPL may include a thin-film transistor layer TFTL, a light emitting element layer EML, a wavelength conversion layer WLCL, and a color filter layer CFL. The thin-film transistor layer TFTL may include a second metal layer MTL2, a buffer layer BF, an active layer ACTL, a gate insulating layer GI, a third metal layer MTL3, an interlayer insulating layer ILD, a fourth metal layer MTL4, a first passivation layer PV1, and a first planarization layer OC1.

The second metal layer MTL2 may be disposed on the third barrier insulating layer BIL3. The second metal layer MTL2 may include the connection portion CWL and first and second voltage lines VL1 and VL2. The connection portion CWL and the first and second voltage lines VL1 and VL2 may be formed of the same material on the same layer, but the disclosure is not limited thereto. For example, the second metal layer MTL2 may be a single layer or a multilayer made of at least one of molybdenum (Mo), aluminum (Al), chromium (Cr), gold (Au), silver (Ag), titanium (Ti), nickel (Ni), palladium (Pd), indium (In), neodymium (Nd), copper (Cu), and alloys thereof.

The connection portion CWL may be inserted into the third contact hole CNT3 and connected to the fan-out line FOL. For example, the connection portion CWL may be electrically connected to a data line to supply a data voltage to a thin-film transistor TFT. The connection portion CWL may be electrically connected to a power line to supply a power supply voltage to the thin-film transistor TFT. The connection portion CWL may be electrically connected to a gate line to supply a gate signal to the gate electrode GE of the thin-film transistor TFT. Therefore, the connection portion CWL may supply a data voltage, a power supply voltage, or a gate signal received from the display driver DIC to the thin-film transistor TFT of a pixel through the fan-out line FOL.

The first and second voltage lines VL1 and VL2 may extend in the second direction (Y-axis direction) in the display area DA. Each of the first and second voltage lines VL1 and VL2 may be electrically connected to the fan-out line FOL. Each of the first and second voltage lines VL1 and VL2 may be electrically connected to a thin-film transistor TFT or a light emitting element ED. For example, each of the first and second voltage lines VL1 and VL2 may be, but is not limited to, a data line, a high potential line, a low potential line, or a sensing line.

The buffer layer BF may be disposed on the second metal layer MTL2 and the third barrier insulating layer BIL3. The buffer layer BF may include an inorganic material that can prevent penetration of air or moisture. For example, the buffer layer BF may include multiple inorganic layers stacked on each other.

The active layer ACTL may be disposed on the buffer layer BF. The active layer ACTL may include a semiconductor region ACT, the drain electrode DE, and a source electrode SE of a thin-film transistor TFT. The semiconductor region ACT may be overlapped by the gate electrode GE in a thickness direction (Z-axis direction) and insulated from the gate electrode GE by the gate insulating layer GI. The drain electrode DE and the source electrode SE may be formed by making the material of the semiconductor region ACT conductive. The thin-film transistor TFT may form a pixel circuit of each of multiple pixels. For example, the thin-film transistor TFT may be a driving transistor or a switching transistor of the pixel circuit.

The gate insulating layer GI may be disposed on the active layer ACTL and the buffer layer BF. The gate insulating layer GI may insulate the semiconductor region ACT and the gate electrode GE of each thin-film transistor TFT. The gate insulating layer GI may include contact holes through which first and second connection electrodes CNE1 and CNE2 pass, respectively.

The third metal layer MTL3 may be disposed on the gate insulating layer GI. The third metal layer MTL3 may include the gate electrode GE of each thin-film transistor TFT. The gate electrode GE may overlap the semiconductor region ACT with the gate insulating layer GI interposed between them. The gate electrode GE may receive a gate signal from a gate line. For example, the third metal layer MTL3 may be a single layer or a multilayer made of at least one of molybdenum (Mo), aluminum (Al), chromium (Cr), gold (Au), silver (Ag), titanium (Ti), nickel (Ni), palladium (Pd), indium (In), neodymium (Nd), copper (Cu), and alloys thereof.

The interlayer insulating layer ILD may be disposed on the third metal layer MTL3. The interlayer insulating layer ILD may insulate the third and fourth metal layers MTL3 and MTL4 from each other. The interlayer insulating layer ILD may include contact holes through which the first and second connection electrodes CNE1 and CNE2 pass, respectively.

The fourth metal layer MTL4 may be disposed on the interlayer insulating layer ILD. The fourth metal layer MTL4 may include the first and second connection electrodes CNE1 and CNE2. The first and second connection electrodes CNE1 and CNE2 may be formed of the same material on the same layer, but the disclosure is not limited thereto. For example, the fourth metal layer MTL4 may be a single layer or a multilayer made of at least one of molybdenum (Mo), aluminum (Al), chromium (Cr), gold (Au), silver (Ag), titanium (Ti), nickel (Ni), palladium (Pd), indium (In), neodymium (Nd), copper (Cu), and alloys thereof.

The first connection electrodes CNE1 may electrically connect the first voltage lines VL1 to the drain electrodes DE of the thin-film transistors TFT. An end of each of the first connection electrodes CNE1 may contact a first voltage line VL1 of the second metal layer MTL2, and another end of each of the first connection electrodes CNE1 may contact a drain electrode DE of the active layer ACTL.

The second connection electrodes CNE2 may electrically connect the source electrodes SE of the thin-film transistors TFT to first electrodes RME1. An end of each of the second connection electrodes CNE2 may contact a source electrode SE of the active layer ACTL, and a first electrode RME1 of the light emitting element layer EML may contact another end of each of the second connection electrode CNE2.

The first passivation layer PV1 may be disposed on the fourth metal layer MTL4 and the interlayer insulating layer ILD. The first protective layer PV1 may protect the thin-film transistors TFT. The first passivation layer PV1 may include contact holes through which the first electrodes RME1 pass.

The first planarization layer OC1 may be disposed on the first passivation layer PV1 to planarize an upper end of the thin-film transistor layer TFTL. For example, the first planarization layer OC1 may include contact holes through which the first electrodes RME1 pass. Here, the contact holes of the first planarization layer OC1 may be connected to the contact holes of the first passivation layer PV1. The first planarization layer OC1 may include an organic insulating material such as polyimide (PI).

The light emitting element layer EML may be disposed on the thin-film transistor layer TFTL. The light emitting element layer EML may include barrier ribs BP, the first electrodes RME1, second electrodes RME2, a first insulating layer PAS1, a sub-bank SB, light emitting elements ED, a second insulating layer PAS2, first contact electrodes CTE1, second contact electrodes CTE2, and a third insulating layer PAS3.

The barrier ribs BP may be disposed on the first planarization layer OC1. The barrier ribs BP may protrude from an upper surface of the first planarization layer OC1. The barrier ribs BP may be disposed in the light emitting area LA or opening area of each of the pixels. Multiple light emitting elements ED may be disposed between the barrier ribs BP. The barrier ribs BP may have inclined side surfaces, and light emitted from the light emitting elements ED may be reflected by the first and second electrodes RME1 and RME2 disposed on the barrier ribs BP. For example, the barrier ribs BP may include an organic insulating material such as polyimide (PI).

The first electrodes RME1 may be disposed on the first planarization layer OC1 and the barrier ribs BP. Each of the first electrodes RME1 may be disposed on a barrier rib BP on a side of the light emitting elements ED. Each of the first electrodes RME1 may be disposed on the inclined side surfaces of the barrier rib BP to reflect light emitted from the light emitting elements ED. Each of the first electrodes RME1 may be inserted into a contact hole formed in the first planarization layer OC1 and the first passivation layer PV1 and may be connected to the second connection electrode CNE2. Each of the first electrodes RME1 may be electrically connected to ends of the light emitting elements ED through a first contact electrode CTE1. For example, each of the first electrodes RME1 may receive a voltage proportional to the luminance of the light emitting elements ED from the thin-film transistor TFT of a pixel.

The second electrodes RME2 may be disposed on the first planarization layer OC1 and the barrier ribs BP. Each of the second electrodes RME2 may be disposed on a barrier rib BP on another side of the light emitting elements ED. Each of the second electrodes RME2 may be disposed on the inclined side surfaces of the barrier rib BP to reflect light emitted from the light emitting elements ED. Each of the second electrodes RME2 may be electrically connected to other ends of the light emitting elements ED through a second contact electrode CTE2. For example, each of the second electrodes RME2 may receive a low-potential voltage supplied to all pixels from a low-potential line.

The first and second electrodes RME1 and RME2 may include a conductive material having high reflectivity. For example, the first and second electrodes RME1 and RME2 may include at least one of aluminum (Al), silver (Ag), copper (Cu), nickel (Ni), and lanthanum (La). As another example, the first and second electrodes RME1 and RME2 may include a material such as indium tin oxide (ITO), indium zinc oxide (IZO) or indium tin zinc oxide (ITZO). As another example, the first and second electrodes RME1 and RME2 may include multiple layers having a transparent conductive material layer and a metal layer having high reflectivity or may include a single layer including a transparent conductive material and a metal having high reflectivity. The first and second electrodes RME1 and RME2 may have a stacked structure of ITO/Ag/ITO, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may protect the first and second electrodes RME1 and RME2 while insulating them from each other. The first insulating layer PAS1 may prevent the light emitting elements ED from directly contacting the first and second electrodes RME1 and RME2 and thus being damaged during an alignment process of the light emitting elements ED.

The sub-bank SB may be disposed on the first insulating layer PAS1 in the light blocking area BA. The sub-bank SB may be disposed at boundaries of the pixels to separate the light emitting elements ED of each of the pixels from those of other pixels. The sub-bank SB may have a predetermined or selected height and may include an organic insulating material such as polyimide (PI).

The light emitting elements ED may be disposed on the first insulating layer PAS1. The light emitting elements ED may be aligned parallel to each other between the first and second electrodes RME1 and RME2. A length of each light emitting element ED may be greater than a distance between the first and second electrodes RME1 and RME2. Each of the light emitting elements ED may include multiple semiconductor layers. A first end may be defined based on a first semiconductor layer, and a second end opposite the first end may be defined based on a second semiconductor layer. The first ends of the light emitting elements ED may be disposed on the first electrodes RME1, and the second ends of the light emitting elements ED may be disposed on the second electrodes RME2. The first ends of the light emitting elements ED may be electrically connected to the first electrodes RME1 through the first contact electrodes CTE1, and the second ends of the light emitting elements ED may be electrically connected to the second electrodes RME2 through the second contact electrodes CTE2.

Each of the light emitting elements ED may be an inorganic light emitting diode having a size of micrometers or nanometers and including an inorganic material. The light emitting elements ED may be aligned between the first and second electrodes RME1 and RME2 facing each other according to an electric field formed in a specific direction between the first and second electrodes RME1 and RME2.

For example, the light emitting elements ED may include active layers having the same material to emit light of the same wavelength band or light of the same color. Light emitted from the first through third light emitting areas LA1 through LA3 may have the same color. For example, the light emitting elements ED may emit light of the third color or blue light having a peak wavelength of about 440 nm to about 480 nm, but the disclosure is not limited thereto.

The second insulating layer PAS2 may be disposed on the light emitting elements ED. For example, the second insulating layer PAS2 may partially cover the light emitting elements ED and may not cover both ends of each of the light emitting elements ED. The second insulating layer PAS2 may protect the light emitting elements ED and anchor the light emitting elements ED during the manufacturing process of the display device 10. The second insulating layer PAS2 may fill a space between the light emitting elements ED and the first insulating layer PAS1.

The first contact electrodes CTE1 may be disposed on the first insulating layer PAS1 and may be inserted into contact holes formed in the first insulating layer PAS1 and thus connected to the first electrodes RME1. For example, the contact holes of the first insulating layer PAS1 may be formed on the barrier ribs BP, but the disclosure is not limited thereto. An end of each of the first contact electrodes CTE1 may be connected to a first electrode RME1 on a barrier rib BP, and another end of each of the first contact electrodes CTE1 may be connected to the first ends of the light emitting elements ED.

The second contact electrodes CTE2 may be disposed on the first insulating layer PAS1 and may be inserted into contact holes formed in the first insulating layer PAS1 and thus connected to the second electrodes RME2. For example, the contact holes of the first insulating layer PAS1 may be formed on the barrier ribs BP, but the disclosure is not limited thereto. An end of each of the second contact electrodes CTE2 may be connected to the second ends of the light emitting elements ED, and another end of each of the second contact electrodes CTE2 may be connected to a second electrode RME2 on a barrier rib BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed on the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion portion WLC1, a second wavelength conversion portion WLC2, a light transmission portion LTU, a second passivation layer PV2, and a second planarization layer OC2.

The first light blocking member BK1 may be disposed on the third insulating layer PAS3 in the light blocking area BA. The first light blocking member BK1 may overlap the sub-bank SB in the thickness direction (Z-axis direction). The first light blocking member BK1 may block transmission of light. The first light blocking member BK1 may prevent color mixing by preventing intrusion of light between the first through third light emitting areas LA1 through LA3, thereby improving a color gamut of the display device 10. The first light blocking member BK1 may be disposed in a lattice shape surrounding the first through third light emitting areas LA1 through LA3 in plan view.

The first wavelength conversion portion WLC1 may be disposed on the third insulating layer PAS3 in the first light emitting area LA1. The first wavelength conversion portion WLC1 may be surrounded by the first light blocking member BK1. The first wavelength conversion portion WLC1 may convert or shift a peak wavelength of incident light into a first peak wavelength. The first wavelength conversion portion WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a portion of transmitted light. For example, the first scatterers SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$) or may include organic particles such as acrylic resin or urethane resin. The first scatterers SCT1 may scatter incident light in random directions regardless of the incident direction of the incident light without substantially converting the peak wavelength of the incident light.

The first wavelength shifters WLS1 may convert or shift the peak wavelength of incident light into the first peak wavelength. For example, the first wavelength shifters WLS1 may convert blue light provided by the display device 10 into red light having a single peak wavelength of about 610 nm to about 650 nm and may emit the red light. The first wavelength shifters WLS1 may be quantum dots, quantum rods, and/or phosphors. The quantum dots may be particulate materials that emit light of a specific color in case that electrons transition from a conduction band to a valence band.

A portion of blue light provided by the light emitting element layer EML may be transmitted through the first wavelength conversion portion WLC1 without being converted into red light by the first wavelength shifters WLS1. Of the blue light provided by the light emitting element layer EML, light incident on a first color filter CF1 without being converted by the first wavelength conversion portion WLC1 may be blocked by the first color filter CF1. Red light into which the blue light provided by the light emitting element layer EML has been converted by the first wavelength conversion portion WLC1 may be emitted to the outside through the first color filter CF1. Therefore, the first light emitting area LA1 may emit red light.

The second wavelength conversion portion WLC2 may be disposed on the third insulating layer PAS3 in the second light emitting area LA2. The second wavelength conversion portion WLC2 may be surrounded by the first light blocking member BK1. The second wavelength conversion portion WLC2 may convert or shift a peak wavelength of incident light into a second peak wavelength. The second wavelength conversion portion WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of any of the materials discussed in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a portion of transmitted light. For example, the second scatterers SCT2 may be made of the same material as the first scatterers SCT1 or may be made of any of the materials discussed in the description of the first scatterers SCT1.

The second wavelength shifters WLS2 may convert or shift the peak wavelength of incident light into the second peak wavelength different from the first peak wavelength of the first wavelength shifters WLS1. For example, the second wavelength shifters WLS2 may convert blue light provided by the display device 10 into green light having a single peak wavelength of about 510 nm to about 550 nm and may emit the green light. The second wavelength shifters WLS2 may be quantum dots, quantum rods, and/or phosphors. The second wavelength shifters WLS2 may include any of the materials discussed in the description of the first wavelength shifters WLS1. The second wavelength shifters WLS2 may be made of quantum dots, quantum rods, and/or phosphors such that their wavelength conversion range is different from the wavelength conversion range of the first wavelength shifters WLS1.

The light transmission portion LTU may be disposed on the third insulating layer PAS3 in the third light emitting area LA3. The light transmission portion LTU may be surrounded by the first light blocking member BK1. The light transmission portion LTU may transmit incident light while maintaining the peak wavelength of the incident light. The light transmission portion LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first or second base resin BS1 or BS2 or may be made of any of the materials discussed in the description of the first base resin BS1.

The third scatterers SCT3 may have a refractive index different from that of the third base resin BS3 and may form an optical interface with the third base resin BS3. For example, the third scatterers SCT3 may include a light scattering material or light scattering particles that scatter at least a portion of transmitted light. For example, the third scatterers SCT3 may be made of the same material as the first or second scatterers SCT1 or SCT2 or may be made of any of the materials discussed in the description of the first scatterers SCT1.

Since the wavelength conversion layer WLCL is directly disposed on the third insulating layer PAS3 of the light emitting element layer EML, the display device 10 may not require a separate substrate for the first and second wavelength conversion portions WLC1 and WLC2 and the light transmission portion LTU. Therefore, the first and second wavelength conversion portions WLC1 and WLC2 and the light transmission portion LTU can be readily aligned in the first through third light emitting areas LA1 through LA3, respectively, and the thickness of the display device 10 can be relatively reduced.

The second passivation layer PV2 may cover the first and second wavelength conversion portions WLC1 and WLC2, the light transmission portion LTU, and the first light blocking member BK1. For example, the second passivation layer PV2 may prevent damage to or contamination of the first and second wavelength conversion portions WLC1 and WLC2 and the light transmission portion LTU by sealing the first and second wavelength conversion portions WLC1 and WLC2 and the light transmission portion LTU. For example, the second passivation layer PV2 may include an inorganic material.

The second planarization layer OC2 may be disposed on the second passivation layer PV2 to planarize upper ends of the first and second wavelength conversion portions WLC1 and WLC2 and the light transmission portion LTU. For example, the second planarization layer OC2 may include an organic insulating material such as polyimide (PI).

The color filter layer CFL may be disposed on the wavelength conversion layer WLCL. The color filter layer CFL may include a second light blocking member BK2, first through third color filters CF1 through CF3, and a third passivation layer PV3.

The second light blocking member BK2 may be disposed on the second planarization layer OC2 of the wavelength conversion layer WLCL in the light blocking area BA. The second light blocking member BK2 may overlap the first light blocking member BK1 or the sub-bank SB in the thickness direction (Z-axis direction). The second light blocking member BK2 may block transmission of light. The second light blocking member BK2 may prevent color mixing by preventing intrusion of light between the first through third light emitting areas LA1 through LA3, thereby improving the color gamut of the display device 10. The second light blocking member BK2 may be disposed in a lattice shape surrounding the first through third light emitting areas LA1 through LA3 in plan view.

The first color filter CF1 may be disposed on the second planarization layer OC2 in the first light emitting area LA1. The first color filter CF1 may be surrounded by the second light blocking member BK2. The first color filter CF1 may overlap the first wavelength conversion portion WLC1 in the thickness direction (Z-axis direction). The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be disposed on the second planarization layer OC2 in the second light emitting area LA2. The second color filter CF2 may be surrounded by the second light blocking member BK2. The second color filter CF2 may overlap the second wavelength conversion portion WLC2 in the thickness direction (Z-axis direction). The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant.

The third color filter CF3 may be disposed on the second planarization layer OC2 in the third light emitting area LA3. The third color filter CF3 may be surrounded by the second light blocking member BK2. The third color filter CF3 may overlap the light transmission portion LTU in the thickness direction (Z-axis direction). The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

The first through third color filters CF1 through CF3 may absorb a portion of light coming from the outside of the display device 10, thereby reducing reflected light due to the external light. Therefore, the first through third color filters CF1 through CF3 may prevent color distortion due to reflection of external light.

Since the first through third color filters CF1 through CF3 are directly disposed on the second planarization layer OC2 of the wavelength conversion layer WLCL, the display device 10 may not require a separate substrate for the first through third color filters CF1 through CF3. Therefore, the thickness of the display device 10 can be relatively reduced.

The third passivation layer PV3 may cover the first through third color filters CF1 through CF3. The third passivation layer PV3 may protect the first through third color filters CF1 through CF3.

The encapsulation layer TFE may be disposed on the third passivation layer PV3 of the color filter layer CFL. The encapsulation layer TFE may cover upper and side surfaces of the display layer DPL. For example, the encapsulation layer TFE may include at least one inorganic layer to prevent penetration of oxygen or moisture. The encapsulation layer TFE may include at least one organic layer to protect the display device 10 from foreign substances such as dust.

The anti-reflection layer ARF may be disposed on the encapsulation layer TFE. The anti-reflection layer ARF may reduce a decrease in visibility due to reflection of external light by preventing reflection of the external light. The anti-reflection layer ARF may protect an upper surface of the display device 10. The anti-reflection layer ARF can be omitted. As another example, the anti-reflection layer ARF may be replaced with a polarizing film.

The flexible film FPCB may be disposed under the first substrate SUB1. The flexible film FPCB may be disposed on an edge of a lower surface of the display device 10. The flexible film FPCB may be attached to the lower surface of the first substrate SUB1 using an adhesive member ADM. The flexible film FPCB may include the lead electrode LDE disposed on an upper surface of a side of the flexible film FPCB. The lead electrode LDE may be inserted into the opening hole OP and electrically connected to the pad portion PAD through the connection film ACF. The flexible film FPCB may support the display driver DIC disposed on a lower surface of another side of the flexible film FPCB. The lead electrode LDE may be electrically connected to the display driver DIC through a lead line (not illustrated) disposed on the lower surface of the flexible film FPCB. The another side of the flexible film FPCB may be connected to a source circuit board (not illustrated) under the first substrate SUB1. The flexible film FPCB may transmit a signal and a voltage of the display driver DIC to the display device 10.

The connection film ACF may attach the lead electrode LDE of the flexible film FPCB to the pad portion PAD. A surface of the connection film ACF may be attached to the pad portion PAD, and another surface of the connection film ACF may be attached to the lead electrode LDE. For example, the connection film ACF may include an anisotropic conductive film. In case that the connection film ACF includes an anisotropic conductive film, the connection film ACF may have conductivity in an area where the pad portion PAD and the lead electrode LDE contact each other and may electrically connect the flexible film FPCB to the fan-out line FOL.

The display driver DIC may be mounted on the flexible film FPCB. The display driver DIC may be an integrated circuit. The display driver DIC may convert digital video data into analog data voltages based on a data control signal received from a timing controller (not illustrated) and may supply the analog data voltages to data lines of the display area DA through the flexible film FPCB. The display driver DIC may supply a power supply voltage received from a power supply unit (not illustrated) to power lines of the display area DA through the flexible film FPCB. The display driver DIC may generate gate signals based on a gate control signal and may sequentially supply the gate signals to gate lines according to a set order. In the display device 10 including the fan-out line FOL disposed on the first substrate SUB1 and the display driver DIC disposed under the first substrate SUB1, the non-display area NDA can be minimized.

Figure 4:
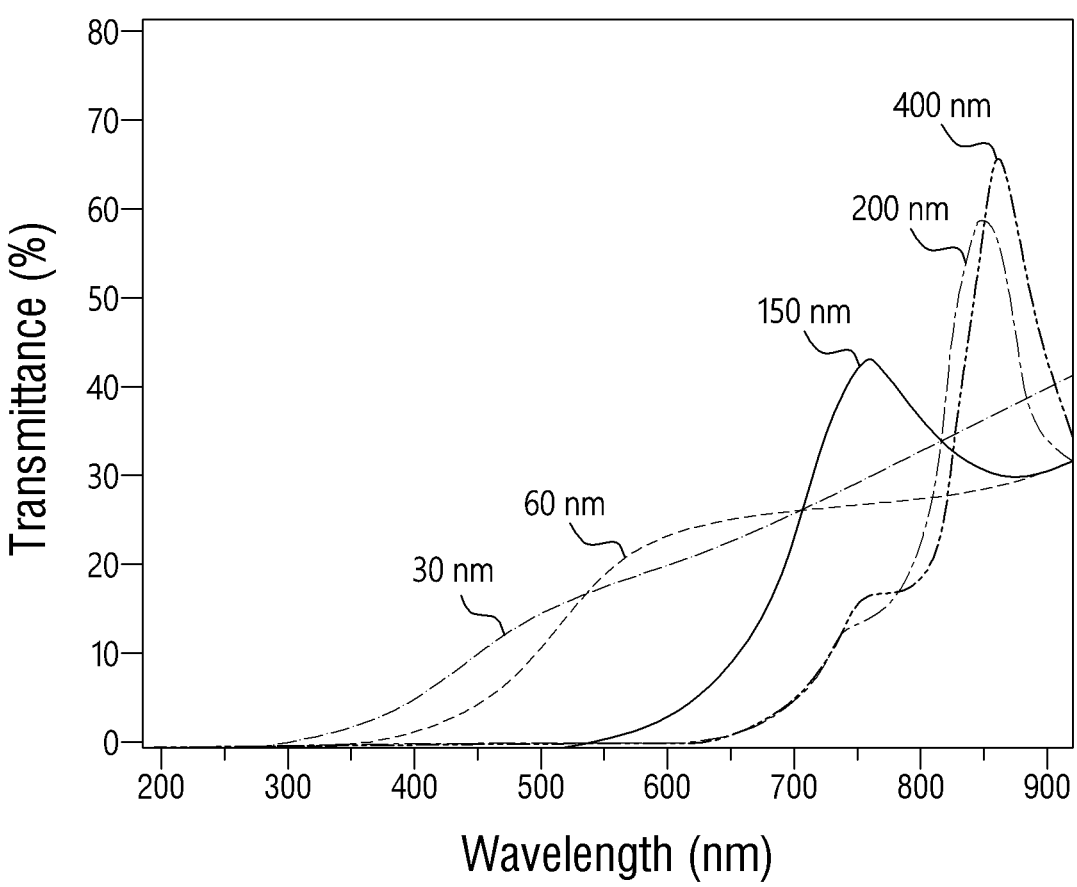
FIG. 4 is a schematic graph illustrating the transmittance of a laser absorption layer with respect to the wavelength of light in the display device according to an embodiment.

FIG. 4 is a schematic graph illustrating the transmittance of the laser absorption layer LAL with respect to the wavelength of light in the display device 10 according to an embodiment.

Referring to FIG. 4, in case that the thickness of the laser absorption layer LAL is 30 nm or 300 Å, the transmittance of light having a wavelength of about 300 nm or less may be close to zero. In case that the thickness of the laser absorption layer LAL is about 60 nm or about 600 Å, the transmittance of light having a wavelength of about 360 nm or less may be close to zero. In case that the thickness of the laser absorption layer LAL is about 150 nm or about 1500 Å, the transmittance of light having a wavelength of about 550 nm or less may be close to zero. In case that the thickness of the laser absorption layer LAL is about 200 nm or about 2000 Å, the transmittance of light having a wavelength of about 640 nm or less may be close to zero. In case that the thickness of the laser absorption layer LAL is about 400 nm or about 4000 Å, the transmittance of light having a wavelength of about 640 nm or less may be close to zero.

Since the display device 10 includes the laser absorption layer LAL having a thickness of about 300 Å to about 1000 Å, in another embodiment about 500 Å, it may absorb UV laser light in the etching process of the first substrate SUB1, thereby preventing damage to the second substrate SUB2 or the display layer DPL.

Figure 5:
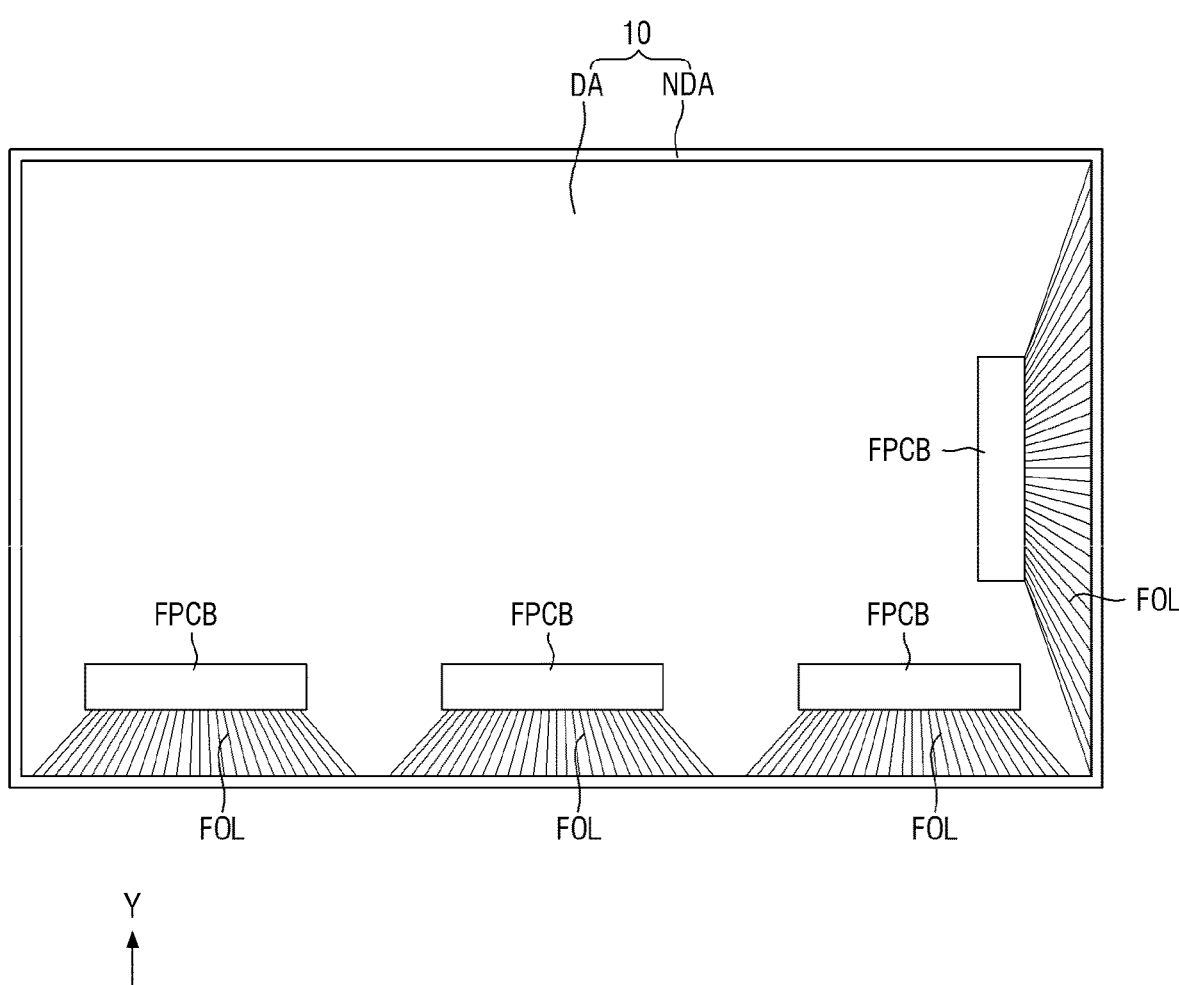
FIG. 5 is a schematic bottom view of the display device according to an embodiment.
Figure 6:
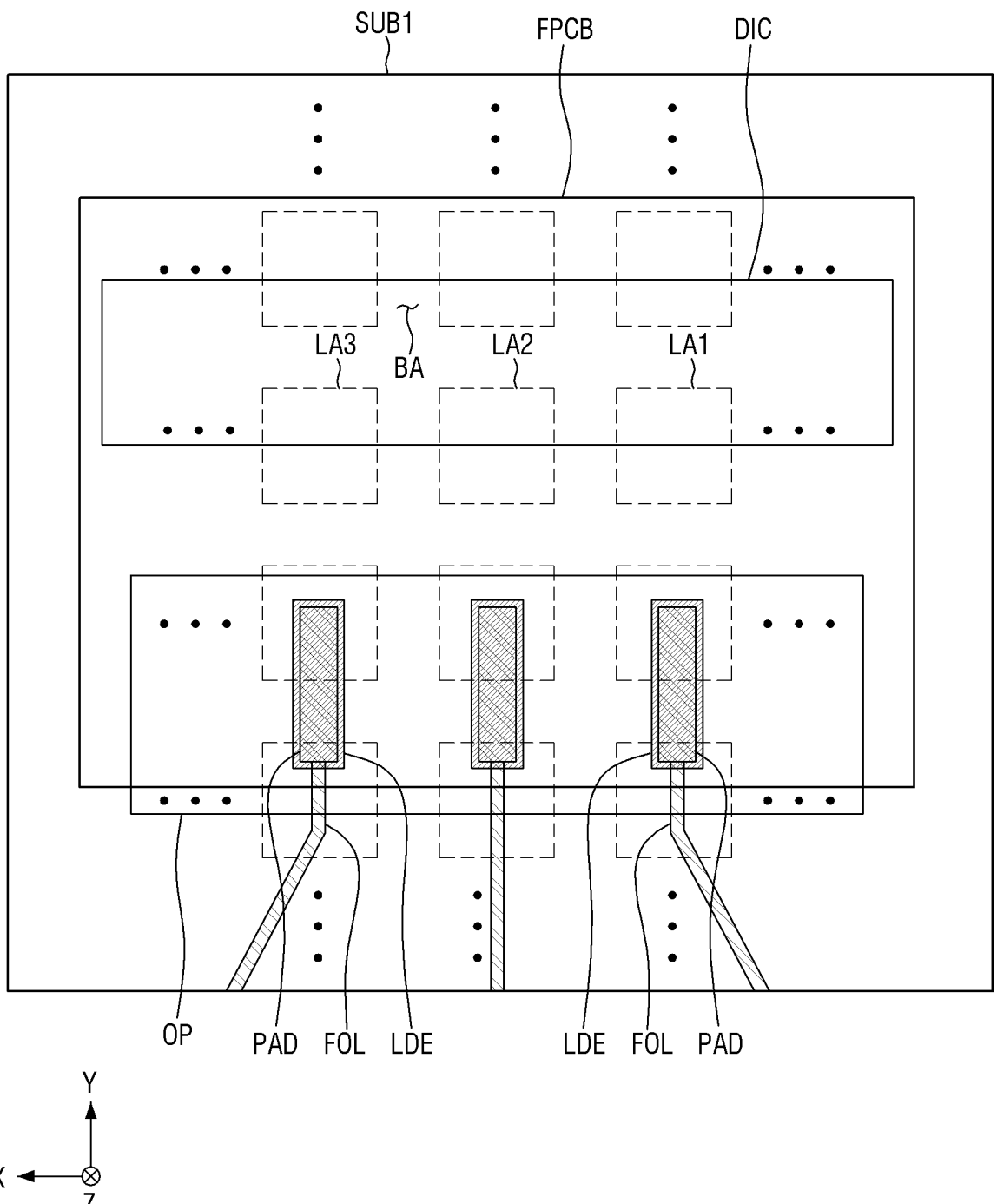
FIG. 6 is an enlarged schematic bottom view of a portion of the display device according to an embodiment.

FIG. 5 is a schematic bottom view of the display device 10 according to an embodiment. FIG. 6 is an enlarged schematic bottom view of a portion of the display device 10 according to an embodiment.

Referring to FIGS. 5 and 6, flexible films FPCB, pad portions PAD, and fan-out lines FOL may be disposed in the display area DA.

The flexible films FPCB may be disposed under the first substrate SUB1. The flexible films FPCB may be disposed on edges of the lower surface of the display device 10. For example, some of the flexible films FPCB may be disposed on an edge of a long side of the display device 10, and some flexible film FPCB may be disposed on an edge of a short side of the display device 10. The flexible films FPCB disposed on the edge of the long side of the display device 10 may supply data voltages and power supply voltages, and the flexible film FPCB disposed on the edge of the short side of the display device 10 may supply gate signals. However, the disclosure is not limited thereto.

The flexible films FPCB may include lead electrodes LDE. The pad portions PAD may correspond to the lead electrodes LDE, respectively. The lead electrodes LDE may be electrically connected to the pad portions PAD through connection films ACF.

Each of the pad portions PAD may be inserted into the first contact hole CNT1 of the laser absorption layer LAL and the second contact hole CNT2 of the first barrier insulating layer BIL1 and may be exposed through the opening hole OP. The pad portions PAD disposed on the edge of the long side of the display device 10 may be arranged in the first direction (X-axis direction). The pad portions PAD disposed on the edge of the short side of the display device 10 may be arranged in the second direction (Y-axis direction).

The fan-out lines FOL may be integrally formed with the pad portions PAD. The fan-out lines FOL may extend from the pad portions PAD to the edges of the display device 10. For example, the fan-out lines FOL disposed on the edge of the long side of the display device 10 may extend in a direction opposite to the second direction (Y-axis direction) of the flexible films FPCB. The fan-out lines FOL disposed on the edge of the short side of the display device 10 may extend in a direction opposite to the first direction (X-axis direction) of the flexible film FPCB. The fan-out lines FOL may be electrically connected to the data lines or gate lines of the display area DA through the connection portions CWL.

Figure 7:
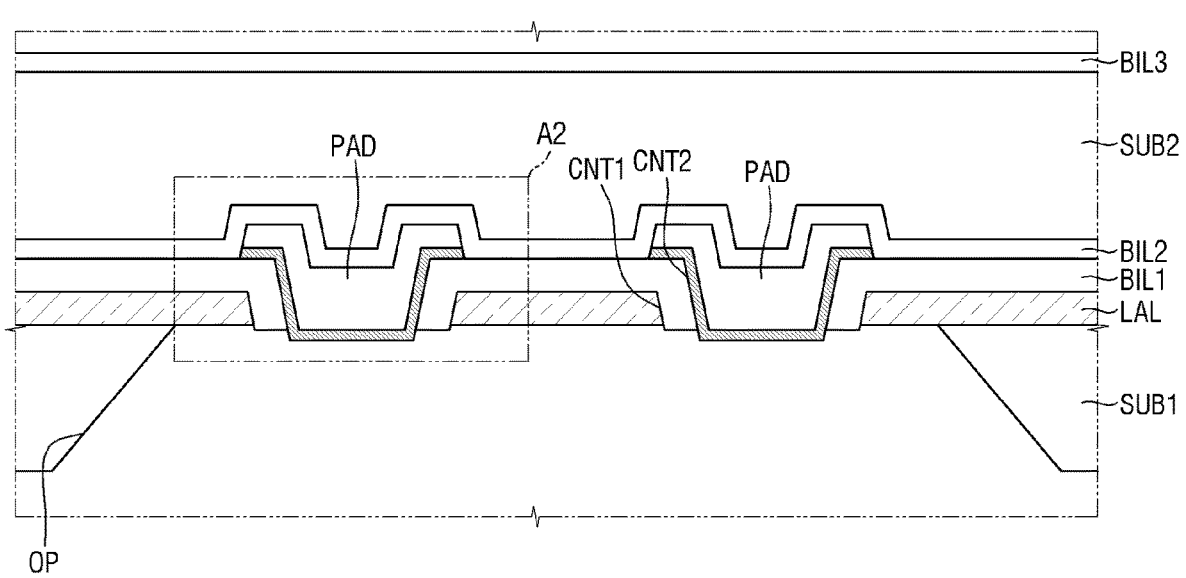
FIG. 7 is a schematic cross-sectional view illustrating the arrangement of pad portions on a bottom surface of the display device according to an embodiment.
Figure 8:
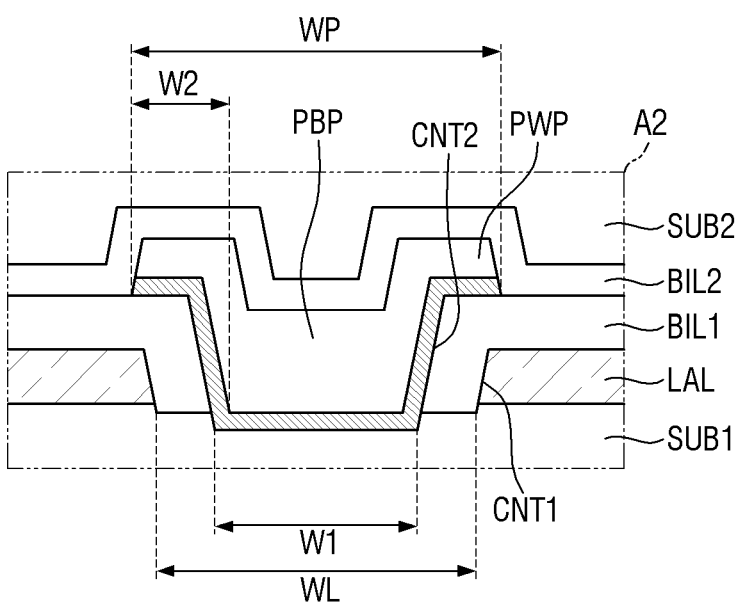
FIG. 8 is an enlarged schematic view of area A2 of FIG. 7.

FIG. 7 is a schematic cross-sectional view illustrating the arrangement of pad portions PAD on a bottom surface of the display device 10 according to an embodiment. FIG. 8 is an enlarged schematic view of area A2 of FIG. 7.

FIG. 7 is a cross-sectional view of the display device 10, illustrating a stacked structure from the first substrate SUB1 to the third barrier insulating layer BIL3. FIG. 8 is an enlarged view of one of the pad portions PAD illustrated in FIG. 7.

Referring to FIGS. 7 and 8, the display device 10 may include multiple pad portions PAD exposed through an opening hole OP formed in the bottom surface of the first substrate SUB1. The pad portions PAD may be spaced apart from each other and may be electrically connected to a flexible film FPCB disposed on the lower surface of the first substrate SUB1 as described above.

According to an embodiment, the laser absorption layer LAL may include multiple first contact holes CNT1, the first barrier insulating layer BIL1 may include multiple second contact holes CNT2 overlapping the first contact holes CNT1, and the pad portions PAD may be disposed in the first contact holes CNT1 of the laser absorption layer LAL and the second contact holes CNT2 of the first barrier insulating layer BILL. The width of each second contact hole CNT2 of the first barrier insulating layer BIL1 may be smaller than the width of each first contact hole CNT1, and a portion of the first barrier insulating layer BIL1 may be disposed on inner sidewalls of the first contact holes CNT1 of the laser absorption layer LAL.

A portion of the first barrier insulating layer BIL1 may be disposed in each of the first contact holes CNT1 of the laser absorption layer LAL. The pad portions PAD may be formed on the laser absorption layer LAL and the first barrier insulating layer BIL1 but may be electrically insulated from the laser absorption layer LAL by the first barrier insulating layer BILL. For example, the first barrier insulating layer BIL1 may be disposed on the inner sidewalls of the first contact holes CNT1 of the laser absorption layer LAL, the pad portions PAD may be disposed in the second contact holes CNT2, and outer surfaces of the pad portions PAD may contact the first barrier insulating layer BILL. The pad portions PAD may not directly contact the laser absorption layer LAL.

According to an embodiment, a portion of the first barrier insulating layer BIL1 which is disposed in each of the first contact holes CNT1 of the laser absorption layer LAL may partially protrude from a lower surface of the laser absorption layer LAL. A lower portion of each pad portion PAD may partially protrude from the lower surface of the laser absorption layer LAL, and the first barrier insulating layer BIL1 may completely cover the inner sidewalls of the first contact holes CNT1 of the laser absorption layer LAL in order to electrically insulate the pad portions PAD and the laser absorption layer LAL from each other. Since the first barrier insulating layer BIL1 covers the inner sidewalls of the first contact holes CNT1 and partially protrudes from the lower surface of the laser absorption layer LAL, it may completely insulate the laser absorption layer LAL from the pad portions PAD.

Each of the pad portions PAD may include a body portion PBP inserted into a first contact hole CNT1 or a second contact hole CNT2 and an extension portion PWP disposed on the first barrier insulating layer BIL1 and extending to both sides of the body portion PBP. As the first contact holes CNT1 or the second contact holes CNT2 become narrower from top to bottom, the body portions PBP of the pad portions PAD may also become narrower toward the bottom. Since each of the pad portions PAD further includes the extension portion PWP, a width W1 of a lower end of the body portion PBP may be smaller than a width of an upper end of the pad portion PAD or a maximum width WP of the pad portion PAD. The width of the upper end of each pad portion PAD or the maximum width WP of each pad portion PAD may be equal to the sum (W1+2W2) of the width W1 of the body portion PBP and widths W2 of the extension portions PWP extending to both sides.

According to an embodiment, a width WL of each first contact hole CNT1 of the laser absorption layer LAL may be greater than the width W1 of the lower end of the body portion PBP of each pad portion PAD, but may be smaller than the width of the upper end of each pad portion PAD or the maximum width WP of each pad portion PAD. The laser absorption layer LAL may not directly contact the pad portions PAD disposed in the first contact holes CNT1 and may be electrically insulated from the pad portions PAD. However, a portion of the laser absorption layer LAL in which the first contact holes CNT1 are not formed may overlap the pad portions PAD in the third direction (Z-axis direction) which is the thickness direction. For example, the laser absorption layer LAL may overlap the extension portions PWP of the pad portions PAD in the thickness direction.

In an embodiment, a first width W1 of the lower end of each pad portion PAD may be about 15 μm, and a distance from another adjacent pad portion PAD may be about 16 μm. A second width W2 of the extension portion PWP on one side of each pad portion PAD may be about 3 μm, and the width of the upper end of each pad portion PAD or the maximum width WP of each pad portion PAD may be about 21 μm. The width WL of each first contact hole CNT1 of the laser absorption layer LAL may be in the range of about 15 μm to 21 μm. The pad portions PAD may be disposed in the first contact holes CNT1, and the laser absorption layer LAL may partially overlap the pad portions PAD in the thickness direction.

In the manufacturing process of the display device 10, the opening hole OP of the first substrate SUB1 may be formed by an etching process through irradiation of UV laser light. The laser light irradiated from the lower surface of the first substrate SUB1 may be absorbed by the pad portions PAD and the laser absorption layer LAL. A gap between the pad portions PAD may be covered by the laser absorption layer LAL, the first contact holes CNT1 of the laser absorption layer LAL may be covered by the pad portions PAD, and the laser absorption layer LAL and the pad portions PAD may be arranged to overlap each other in the thickness direction. Therefore, the UV laser light may be unable to pass through the laser absorption layer LAL and the pad portions PAD. In the display device 10, the arrangement of the pad portions PAD and the laser absorption layer LAL may be designed such that all of the laser light is absorbed by the pad portions PAD and the laser absorption layer LAL in a laser process for etching the first substrate SUB1. Accordingly, it is possible to prevent the lifting of the second substrate SUB2 or damage to the second substrate SUB2 and the display layer DPL.

However, as described above, the laser absorption layer LAL may include amorphous silicon (a-Si). The amorphous silicon may be crystallized into polysilicon (p-Si) by the irradiated UV laser light, and at least a portion of the laser absorption layer LAL may include the polysilicon (p-Si). In case that the pad portions PAD directly contact the laser absorption layer LAL, they are likely to conduct electricity to other adjacent pad portions PAD through the crystallized laser absorption layer LAL. To prevent this, in the display device 10 according to an embodiment, the first barrier insulating layer BIL1 may be disposed in the first contact holes CNT1 of the laser absorption layer LAL, and the pad portions PAD may be electrically insulated from the laser absorption layer LAL by the insulating layer BILL. Since the pad portions PAD are electrically insulated from or not in direct contact with the laser absorption layer LAL, even if a portion of the laser absorption layer LAL is crystallized by the irradiated UV laser light, electrical failure due to the laser absorption layer LAL can be prevented.

Figure 9:
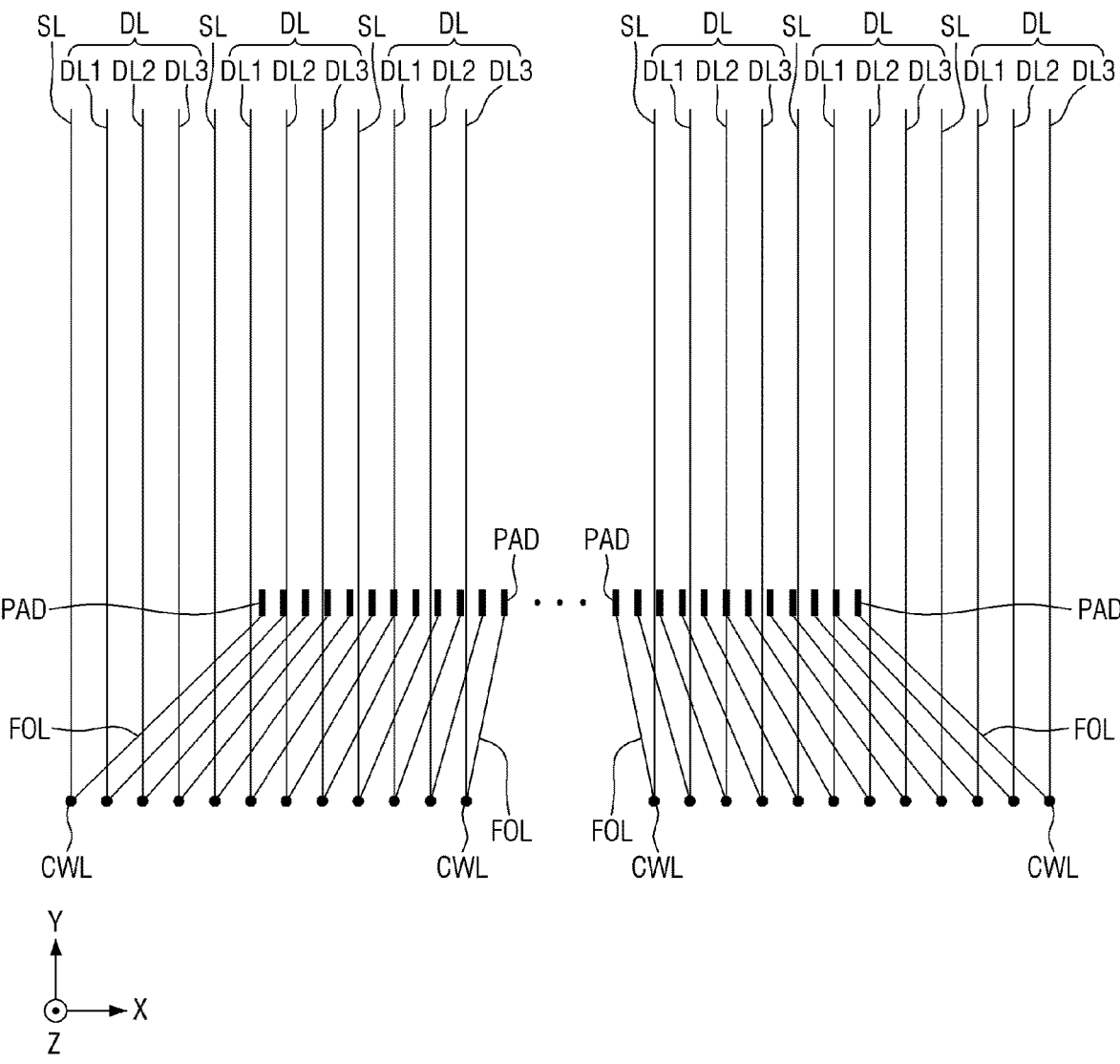
FIG. 9 schematically illustrates pad portions, fan-out lines, sensing lines, and data lines in the display device according to an embodiment.
Figure 10:
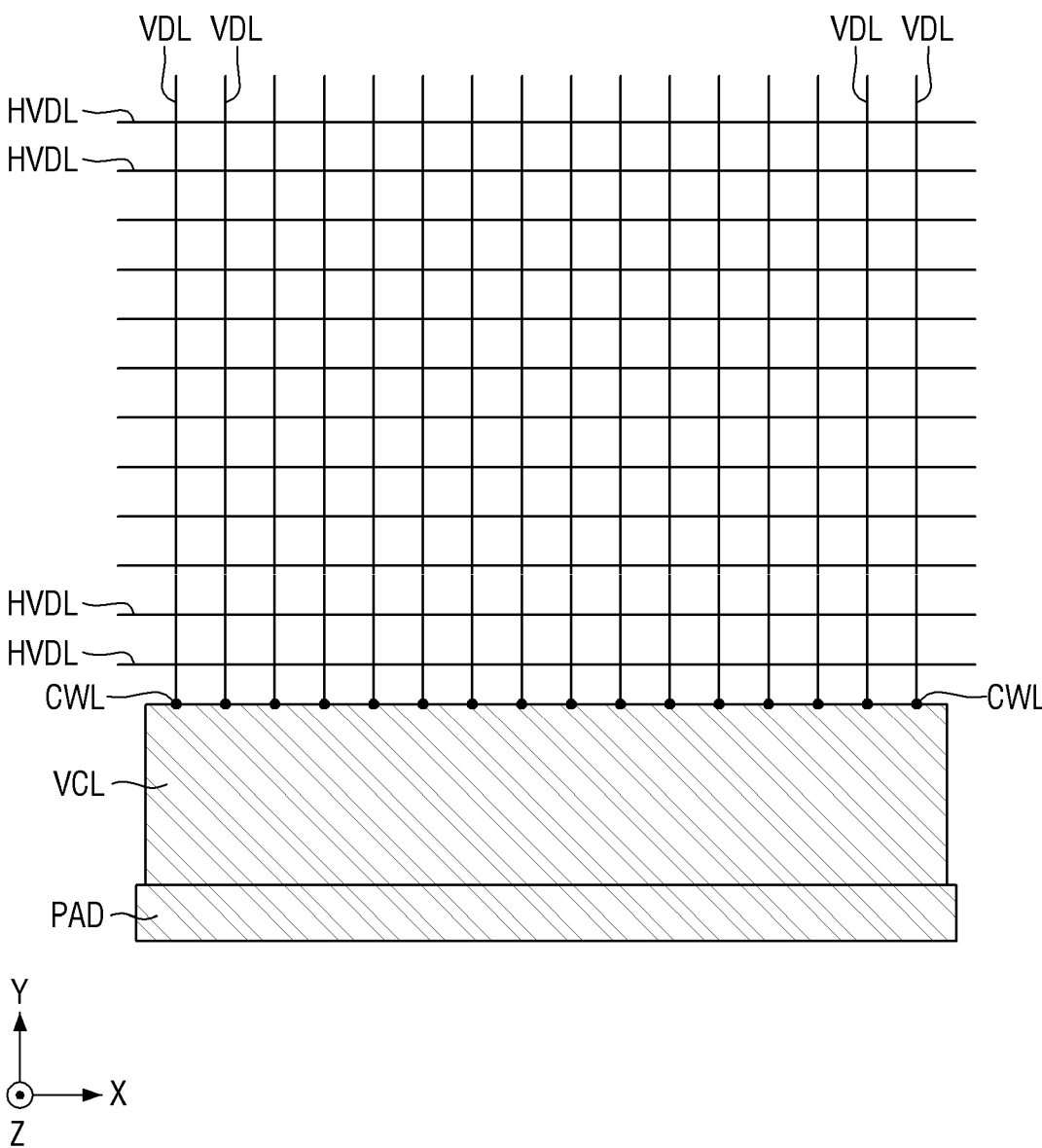
FIG. 10 schematically illustrates a pad portion, a power connection line, high potential lines, and horizontal voltage lines in the display device according to an embodiment.
Figure 11:
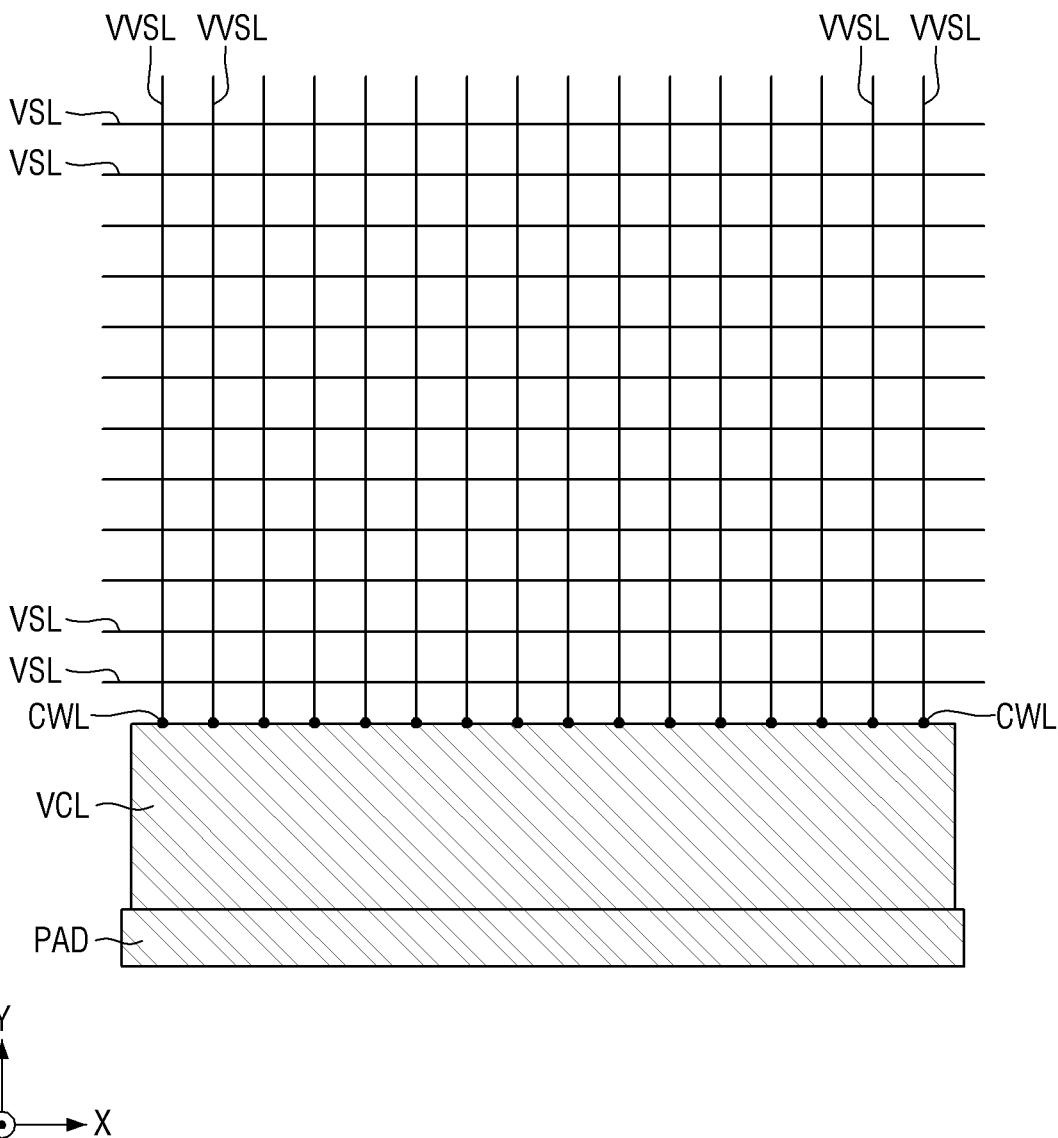
FIG. 11 schematically illustrates a pad portion, a power connection line, low potential lines, and vertical voltage lines in the display device according to an embodiment.
Figure 12:
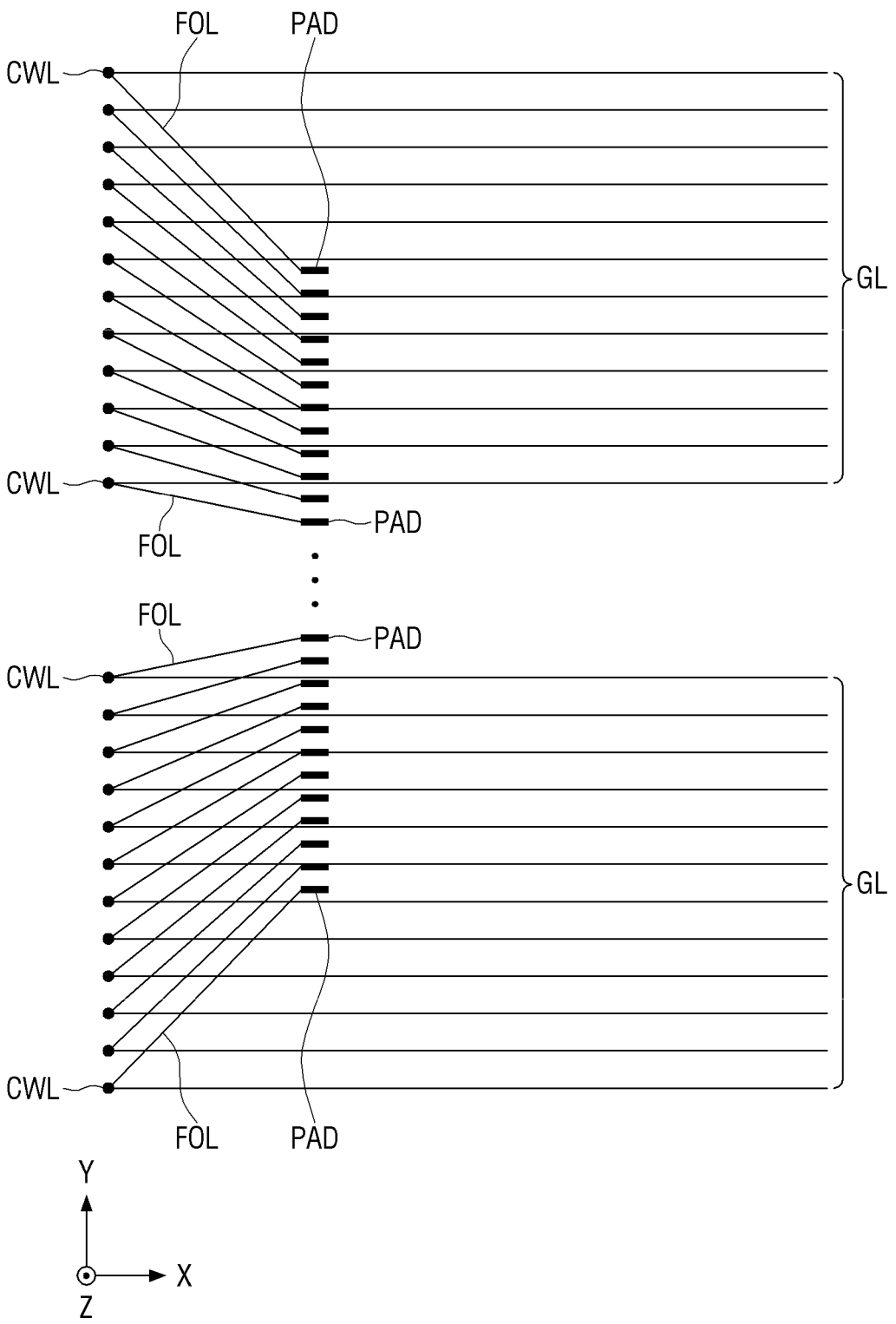
FIG. 12 schematically illustrates pad portions, fan-out lines, and gate lines in the display device according to an embodiment.

FIG. 9 schematically illustrates pad portions PAD, fan-out lines FOL, sensing lines SL, and data lines DL in the display device 10 according to an embodiment. FIG. 10 schematically illustrates a pad portion PAD, a power connection line VCL, high potential lines VDL, and horizontal voltage lines HVDL in the display device 10 according to an embodiment. FIG. 11 schematically illustrates a pad portion PAD, a power connection line VCL, low potential lines VSL, and vertical voltage lines VVSL in the display device 10 according to an embodiment. FIG. 12 schematically illustrates pad portions PAD, fan-out lines FOL, and gate lines GL in the display device 10 according to an embodiment.

Referring to FIGS. 9 through 12, the display area DA may include the sensing lines SL, the data lines DL, the high potential lines VDL, the horizontal voltage lines HVDL, the low potential lines VSL, the vertical voltage lines VVSL, and the gate lines GL.

The sensing lines SL may extend in the second direction (Y-axis direction) and may be spaced apart from each other in the first direction (X-axis direction). Referring also to FIG. 2, the sensing lines SL may be disposed in the second metal layer MTL2 to extend in the second direction (Y-axis direction). The sensing lines SL may be electrically connected to the fan-out lines FOL of the first metal layer MTL1 through connection portions CWL. The sensing lines SL may cross the fan-out lines FOL in plan view. The sensing lines SL may receive initialization voltages through the pad portions PAD. The sensing lines SL may provide sensing signals to the pad portions PAD.

The data lines DL may include first through third data lines DL1 through DL3. The first through third data lines DL1 through DL3 may extend in the second direction (Y-axis direction) and may be spaced apart from each other in the first direction (X-axis direction). Referring also to FIG. 2, the data lines DL may be disposed in the second metal layer MTL2 to extend in the second direction (Y-axis direction). The data lines DL may be electrically connected to the fan-out lines FOL of the first metal layer MTL1 through the connection portions CWL. The data lines DL may cross the fan-out lines FOL in plan view. The data lines DL may receive data voltages through the pad portions PAD.

The high potential lines VDL may extend in the second direction (Y-axis direction) and may be spaced apart from each other in the first direction (X-axis direction). The high potential lines VDL may be connected to the horizontal voltage lines HVDL crossing the high potential lines VDL and may supply high potential voltages to the horizontal voltage lines HVDL. Referring also to FIG. 2, the high potential lines VDL may be disposed in the second metal layer MTL2 to extend in the second direction (Y-axis direction). The high potential lines VDL may be electrically connected to a power connection line VCL of the first metal layer MTL1 through the connection portions CWL. The high potential lines VDL may receive a high potential voltage through each pad portion PAD.

The horizontal voltage lines HVDL may extend in the first direction (X-axis direction) and may be spaced apart from each other in the second direction (Y-axis direction). The horizontal voltage lines HVDL may be connected to the high potential lines VDL crossing the horizontal voltage lines HVDL and may receive high potential voltages from the high potential lines VDL. Referring also to FIG. 2, the horizontal voltage lines HVDL may be disposed in the fourth metal layer MTL4 to extend in the first direction (X-axis direction).

The vertical voltage lines VVSL may extend in the second direction (Y-axis direction) and may be spaced apart from each other in the first direction (X-axis direction). The vertical voltage lines VVSL may be connected to the low potential lines VSL crossing the vertical voltage lines VVSL and may supply low potential voltages to the low potential lines VSL. Referring also to FIG. 2, the vertical voltage lines VVSL may be disposed in the second metal layer MTL2 to extend in the second direction (Y-axis direction). The vertical voltage lines VVSL may be electrically connected to a power connection line VCL of the first metal layer MTL1 through the connection portions CWL. The vertical voltage lines VVSL may receive a low potential voltage through each pad portion PAD.

The low potential lines VSL may extend in the first direction (X-axis direction) and may be spaced apart from each other in the second direction (Y-axis direction). The low potential lines VSL may be connected to the vertical voltage lines VVSL crossing the low potential lines VSL and may receive low potential voltages from the vertical voltage lines VVSL. Referring also to FIG. 2, the low potential lines VSL may be disposed in the fourth metal layer MTL4 to extend in the first direction (X-axis direction).

The gate lines GL may extend in the first direction (X-axis direction) and may be spaced apart from each other in the second direction (Y-axis direction). Referring also to FIG. 2, the gate lines GL may be disposed in the third metal layer MTL3 or the fourth metal layer MTL4 to extend in the first direction (X-axis direction). The gate lines GL may be electrically connected to the fan-out lines FOL of the first metal layer MTL1 through the connection portions CWL. The gate lines GL may cross the fan-out lines FOL in plan view. The gate lines GL may receive gate signals through the pad portions PAD.

Figure 13:
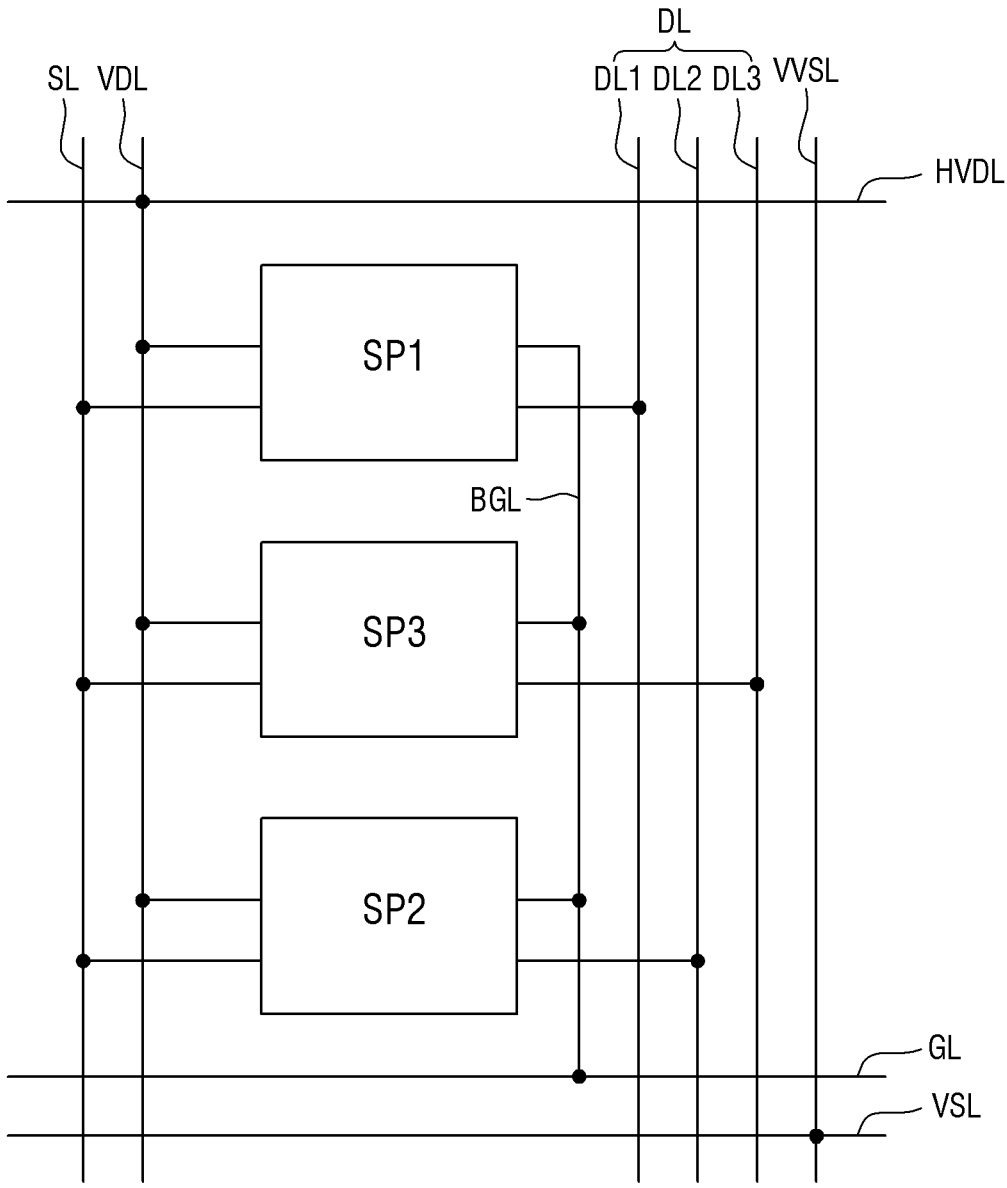
FIG. 13 is a schematic block diagram illustrating pixels and lines of the display device according to an embodiment.
Figure 14:
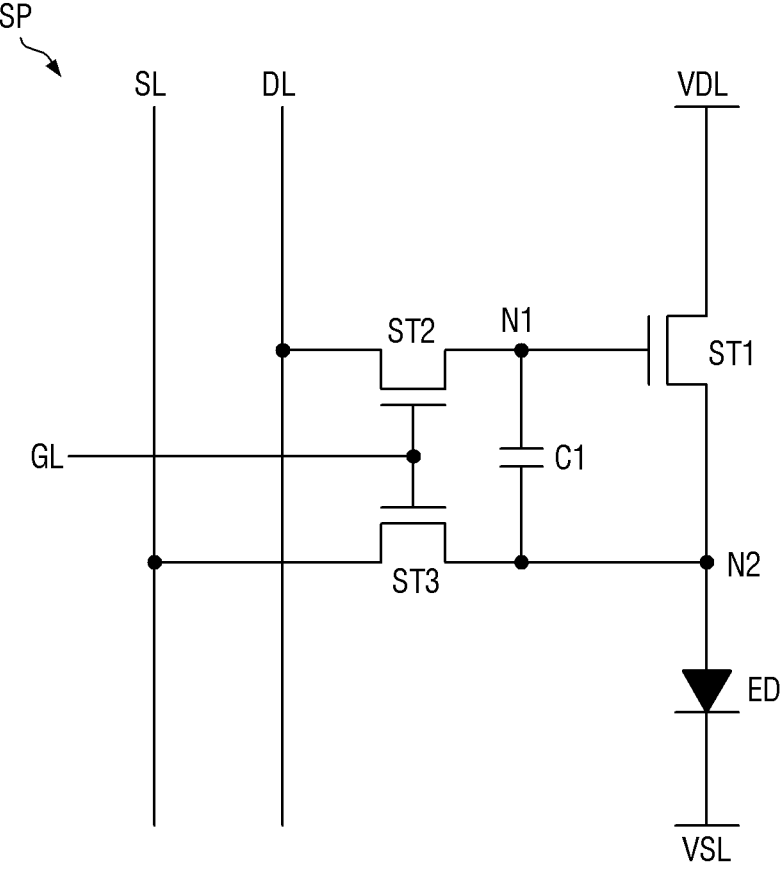
FIG. 14 is a schematic circuit diagram of a pixel of FIG. 13.

FIG. 13 is a schematic block diagram illustrating pixels SP and lines of the display device 10 according to an embodiment. FIG. 14 is a schematic circuit diagram of a pixel SP of FIG. 13.

Referring to FIGS. 13 and 14, the pixels SP may include first through third pixels SP1 through SP3. A pixel circuit of the first pixel SP1, a pixel circuit of the third pixel SP3, and a pixel circuit of the second pixel SP2 may be arranged in a direction opposite to the second direction (Y-axis direction). However, the order of the pixel circuits is not limited thereto.

Each of the first through third pixels SP1 through SP3 may be connected to a high potential line VDL, a sensing line SL, a gate line GL, and a data line DL.

The high potential line VDL may extend in the second direction (Y-axis direction). The high potential line VDL may be disposed on a left side of the pixel circuit of each of the first through third pixels SP1 through SP3. The high potential line VDL may supply a high potential voltage to transistors of each of the first through third pixels SP1 through SP3.

A horizontal voltage line HVDL may extend in the first direction (X-axis direction). The horizontal voltage line HVDL may be disposed above the pixel circuit of the first pixel SP1. The horizontal voltage line HVDL may be connected to the high potential line VDL. The horizontal voltage line HVDL may receive a high potential voltage from the high potential line VDL.

The sensing line SL may extend in the second direction (Y-axis direction). The sensing line SL may be disposed on a left side of the high potential line VDL. The sensing line SL may supply an initialization voltage to the pixel circuit of each of the first through third pixels SP1 through SP3. The sensing line SL may receive a sensing signal from the pixel circuit of each of the first through third pixels SP1 through SP3 and supply the sensing signal to the display driver DIC.

The gate line GL may extend in the first direction (X-axis direction). Referring also to FIG. 2, the gate line GL may be disposed in the third metal layer MTL3 or the fourth metal layer MTL4. The gate line GL may be disposed below the pixel circuit of the second pixel SP2. The gate line GL may be disposed above a low potential line VSL. The gate line GL may supply a gate signal to an auxiliary gate line BGL.

The auxiliary gate line BGL may extend from the gate line GL in the second direction (Y-axis direction). Referring also to FIG. 2, the auxiliary gate line BGL may be disposed in the third metal layer MTL3. A portion of the auxiliary gate line BGL may be the gate electrode GE of a second transistor ST2, and another portion of the auxiliary gate line BGL may be the gate electrode GE of a third transistor ST3. The auxiliary gate line BGL may be disposed on a right side of the pixel circuit of each of the first through third pixels SP1 through SP3. The auxiliary gate line BGL may supply a gate signal received from the gate line GL to the pixel circuits of the first through third pixels SP1 through SP3.

The data lines DL may extend in the second direction (Y-axis direction). The data lines DL may supply data voltages to the pixels SP. The data line DL may include the first through third data lines DL1 through DL3.

The first data line DL1 may extend in the second direction (Y-axis direction). The first data line DL1 may be disposed on a right side of the auxiliary gate line BGL. The first data line DL1 may supply a data voltage received from the display driver DIC to the pixel circuit of the first pixel SP1.

The second data line DL2 may extend in the second direction (Y-axis direction). The second data line DL2 may be disposed on a right side of the first data line DLL. The second data line DL2 may supply a data voltage received from the display driver DIC to the pixel circuit of the second pixel SP2.

The third data line DL3 may extend in the second direction (Y-axis direction). The third data line DL3 may be disposed on a right side of the second data line DL2. The third data line DL3 may supply a data voltage received from the display driver DIC to the pixel circuit of the third pixel SP3.

A vertical voltage line VVSL may extend in the second direction (Y-axis direction). The vertical voltage line VVSL may be disposed on a right side of the third data line DL3. The vertical voltage line VVSL may be connected to the low potential line VSL and may supply a low potential voltage to the low potential line VSL.

The low potential line VSL may extend in the first direction (X-axis direction). The low potential line VSL may be disposed below the gate line GL. The low potential line VSL may supply a low potential voltage received from the vertical voltage line VVSL to the light emitting elements ED of the first through third pixels SP1 through SP3.

Each of the first through third pixels SP1 through SP3 may include the pixel circuit and a light emitting element ED. Each of the pixel circuits of the first through third pixels SP1 through SP3 may include first through third transistors ST1 through ST3 and a first capacitor C1.

The first transistor ST1 may include a gate electrode, a drain electrode, and a source electrode. The first transistor ST1 may have the gate electrode connected to a first node N1, the drain electrode connected to the high potential line VDL, and the source electrode connected to a second node N2. The first transistor ST1 may control a drain-source current (or a driving current) based on a data voltage applied to the gate electrode.

The light emitting element ED may include at least one light emitting element ED. In case that the light emitting element ED includes multiple light emitting elements ED, the light emitting elements ED may be connected in series or in parallel. The light emitting element ED may emit light in response to a driving current received from the first transistor ST1. The amount of light emitted from the light emitting element ED or the luminance of the light emitting element ED may be proportional to the magnitude of the driving current. The light emitting element ED may be, but is not limited to, an inorganic light emitting element including an inorganic semiconductor.

A first electrode of the light emitting element ED may be connected to the second node N2, and a second electrode of the light emitting element ED may be connected to the low potential line VSL. The first electrode of the light emitting element ED may be connected to the source electrode of the first transistor ST1, a drain electrode of the third transistor ST3, and a second capacitor electrode of the first capacitor C1 through the second node N2.

The second transistor ST2 may be turned on by a gate signal of the gate line GL to electrically connect the data line DL and the first node N1 which is the gate electrode of the first transistor ST1. The second transistor ST2 turned on based on the gate signal may supply a data voltage to the first node N1. The second transistor ST2 may have a gate electrode connected to the gate line GL, a drain electrode connected to the data line DL, and a source electrode connected to the first node N1.

The third transistor ST3 may be turned on by the gate signal of the gate line GL to electrically connect the sensing line SL and the second node N2 which is the source electrode of the first transistor ST1. The third transistor ST3 turned on based on the gate signal may supply an initialization voltage to the second node N2 and supply a sensing signal to the sensing line SL. The third transistor ST3 may have a gate electrode connected to the gate line GL, the drain electrode connected to the second node N2, and a source electrode connected to the sensing line SL.

Figure 15:
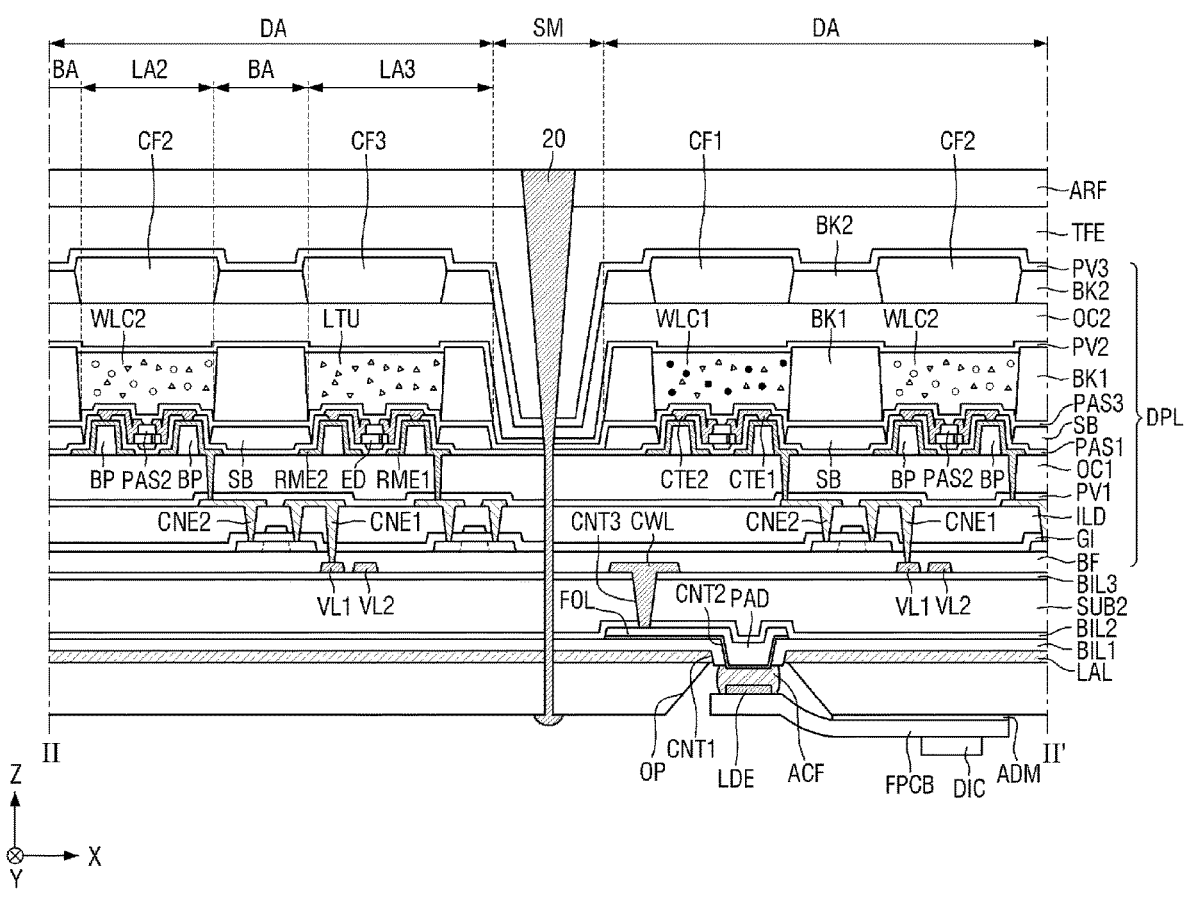
FIG. 15 is a schematic cross-sectional view taken along line II-II' of FIG. 1.

FIG. 15 is a schematic cross-sectional view taken along line II-II' of FIG. 1.

Referring to FIG. 15, the tiled display device TD may include multiple display devices 10 and a coupling member 20. The tiled display device TD may include the first through fourth display devices 10-1 through 10-4. The number and coupling relationship of the display devices 10 are not limited to an embodiment of FIG. 1. The number of display devices 10 may be determined by the size of each of the display devices 10 and the tiled display device TD.

Each of the display devices 10 may include the display area DA and the non-display area NDA. The display area DA may include pixels SP to display an image. The non-display area NDA may be disposed around the display area DA to surround the display area DA and may not display an image.

The tiled display device TD may include the coupling area SM disposed between display areas DA. The tiled display device TD may be formed by connecting the respective non-display areas NDA of adjacent display devices 10. The display devices 10 may be connected to each other through the coupling member 20 or an adhesive member disposed in the coupling area SM. The coupling area SM of each of the display devices 10 may not include a pad portion or a fan-out line connected to the pad portion. Therefore, the distance between the respective display areas DA of the display devices 10 may be small enough to make the coupling area SM unrecognizable by a user. The external light reflectance of the display area DA of each of the display devices 10 and the external light reflectance of the coupling area SM may be substantially equal. Therefore, the tiled display device TD may eliminate a sense of separation between the display devices 10 and improve the degree of immersion in images by preventing the coupling area SM between the display devices 10 from being recognized by a user.

The tiled display device TD may be formed by coupling side surfaces of adjacent display devices 10 to each other using the coupling member 20 disposed between the display devices 10. The coupling member 20 may connect side surfaces of the first through fourth display devices 10-1 through 10-4 arranged in a lattice shape, thereby realizing the tiled display device TD. The coupling member 20 may couple side surfaces of the first substrates SUB1, side surfaces of the first through third barrier insulating layers BIL1 through BIL3, side surfaces of the second substrates SUB2, side surfaces of the third barrier insulating layers BIL3, side surfaces of the display layers DPL, side surfaces of the encapsulation layers TFE, and side surfaces of the anti-reflection layers ARF of adjacent display devices 10.

For example, the coupling member 20 may be made of an adhesive or double-sided tape having a relatively small thickness to minimize the distance between the display devices 10. As another example, the coupling member 20 may be made of a coupling frame having a relatively small thickness to minimize the distance between the display devices 10. Therefore, the tiled display device TD may prevent the coupling area SM between the display devices 10 from being recognized by a user.

A process of manufacturing a display device 10 will now be described with reference to additional drawings.

FIGS. 16 through 26 are schematic cross-sectional views illustrating a process of manufacturing a display device 10 according to an embodiment. FIGS. 16 through 21 schematically illustrate a process of forming pad portions PAD. FIGS. 22 through 26 schematically illustrate a process of forming a display layer DPL and a laser process for forming an opening hole OP in a first substrate SUB1. In the following description of the process of manufacturing the display device 10, the formation process of each layer will not be described, and the formation order of each layer will be described.

Figure 16:
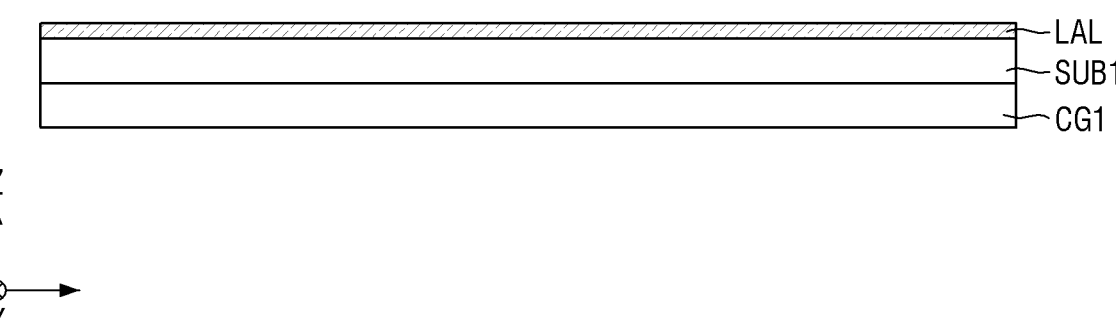
FIGS. 16 through 26 are schematic cross-sectional views illustrating a process of manufacturing a display device according to an embodiment.
Figure 17:
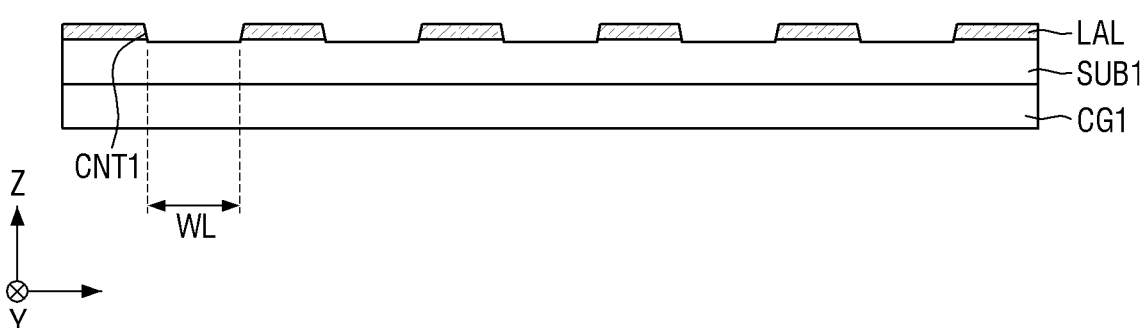

Referring to FIGS. 16 and 17, a first carrier substrate CG1 on which the first substrate SUB1 and a laser absorption layer LAL are disposed may be prepared, and first contact holes CNT1 penetrating the laser absorption layer LAL may be formed.

The first carrier substrate CG1 may support the display device 10 during the manufacturing process of the display device 10. For example, the first carrier substrate CG1 may be, but is not limited to, a carrier glass. The first substrate SUB1 may be disposed on the first carrier substrate CG1, and the laser absorption layer LAL may be disposed on the first substrate SUB1. The materials, thicknesses, etc. of the above elements may be the same as those described above, and thus a description thereof will be omitted.

The first contact holes CNT1 may be formed to penetrate the laser absorption layer LAL and may be formed such that a portion of an upper surface of the first substrate SUB1 is recessed. A first barrier insulating layer BIL1 and the pad portions PAD disposed in the first contact holes CNT1 may be formed to partially protrude from a lower surface of the laser absorption layer LAL.

Figure 18:
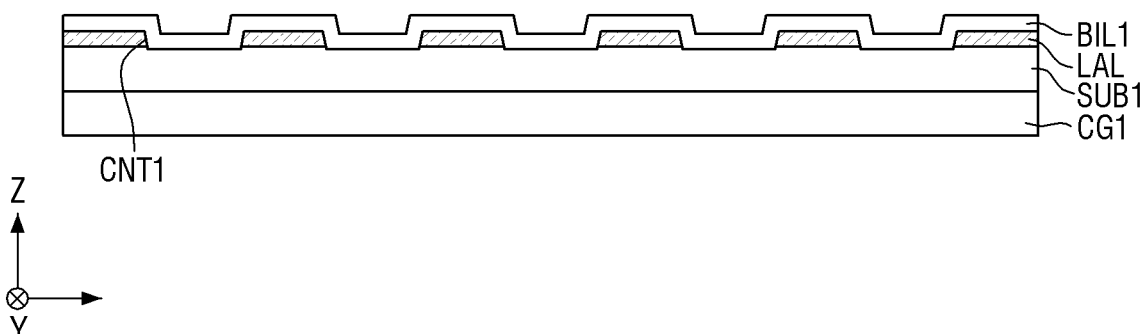
Figure 19:
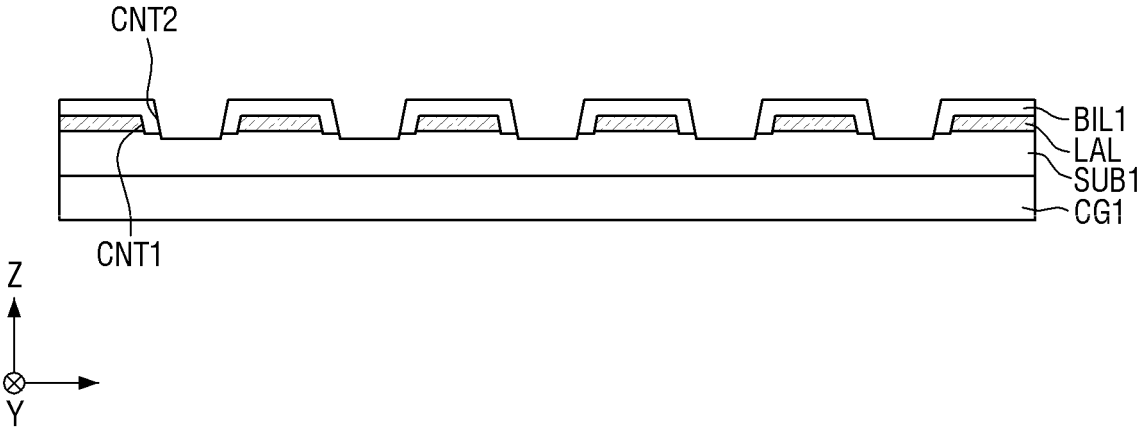

Referring to FIGS. 18 and 19, the first barrier insulating layer BIL1 may be formed on the laser absorption layer LAL, and second contact holes CNT2 penetrating the first barrier insulating layer BIL1 may be formed. The second contact holes CNT2 may be formed to correspond to the first contact holes CNT1 of the laser absorption layer LAL, respectively. The first barrier insulating layer BIL1 may also be formed on the upper surface of the first substrate SUB1 exposed by the first contact holes CNT1, and the upper surface of the first substrate SUB1 may be partially exposed again as the second contact holes CNT2 are formed.

Since the first contact holes CNT1 are formed to penetrate the laser absorption layer LAL and are formed such that a portion of the upper surface of the first substrate SUB1 is recessed, a portion of the first barrier insulating layer BIL1 may be formed to protrude downward from the lower surface of the laser absorption layer LAL. Since the second contact holes CNT2 are formed to penetrate the first barrier insulating layer BIL1 and are formed such that a portion of the upper surface of the first substrate SUB1 is recessed, a portion of each of the pad portions PAD disposed in the second contact holes CNT2 may also be formed to protrude from the lower surface of the laser absorption layer LAL.

Figure 20:
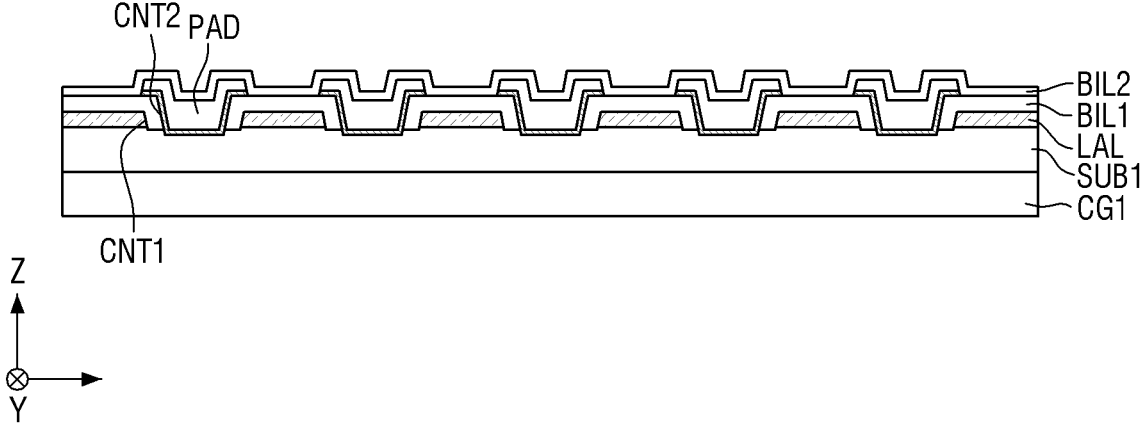

Referring to FIG. 20, multiple pad portions PAD may be formed in the first contact holes CNT1 and the second contact holes CNT2. Each of the pad portions PAD may be formed as a double layer including a lower metal layer and an upper metal layer. Body portions of the pad portions PAD may be inserted into the second contact holes CNT2, and extension portions of the pad portions PAD may be directly disposed on the first barrier insulating layer BILL.

Since each of the first contact holes CNT1 and the second contact holes CNT2 is formed such that a portion of the upper surface of the first substrate SUB1 is recessed, each of the pad portions PAD may be formed to contact the recessed portion of the first substrate SUB1. A lower surface of each of the pad portions PAD may be formed to protrude from the lower surface of the laser absorption layer LAL.

Figure 21:
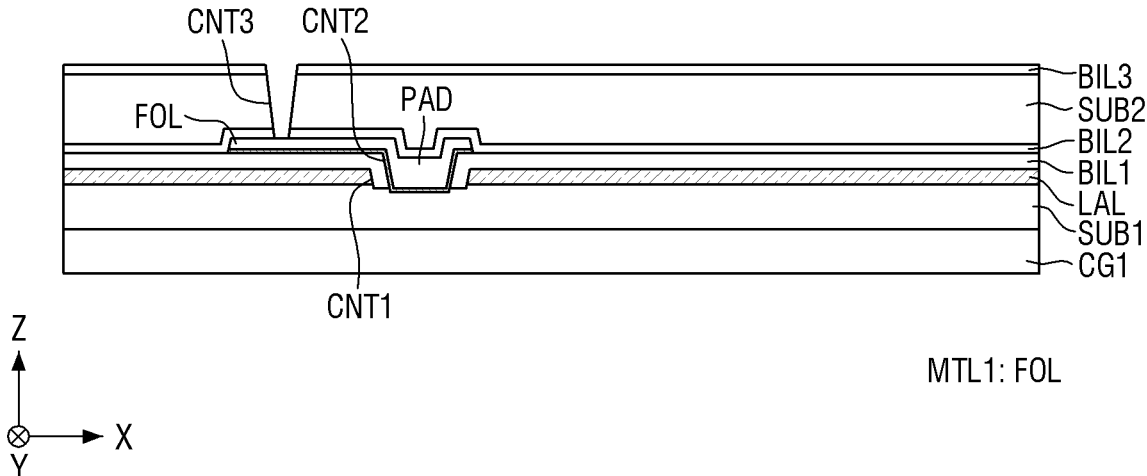

Referring to FIG. 21, a second barrier insulating layer BIL2 may be formed on the first barrier insulating layer BIL1 and the pad portions PAD, a second substrate SUB2 and a third barrier insulating layer BIL3 may be formed on the second barrier insulating layer BIL2, and a third contact hole CNT3 may be formed.

The second barrier insulating layer BIL2 may be disposed on the first barrier insulating layer BIL1 and a fan-out line FOL. The second barrier insulating layer BIL2 may include an inorganic layer that can prevent penetration of air or moisture. The fan-out line FOL may be disposed on the same layer as each pad portion PAD to correspond to the pad portion PAD. For example, the fan-out line FOL may be integrated with each pad portion PAD and disposed on the first barrier insulating layer BIL1.

The second substrate SUB2 and the third barrier insulating layer BIL3 may be stacked on each other on the second barrier insulating layer BIL2. The third contact hole CNT3 may be etched from an upper surface of the third barrier insulating layer BIL3 through to a lower surface of the second barrier insulating layer BIL2. For example, the third barrier insulating layer BIL3 and the second substrate SUB2 may be penetrated through a dry etching process or a wet etching process, but the disclosure is not limited thereto. An upper surface of the fan-out line FOL may be exposed by the third contact hole CNT3.

Figure 22:
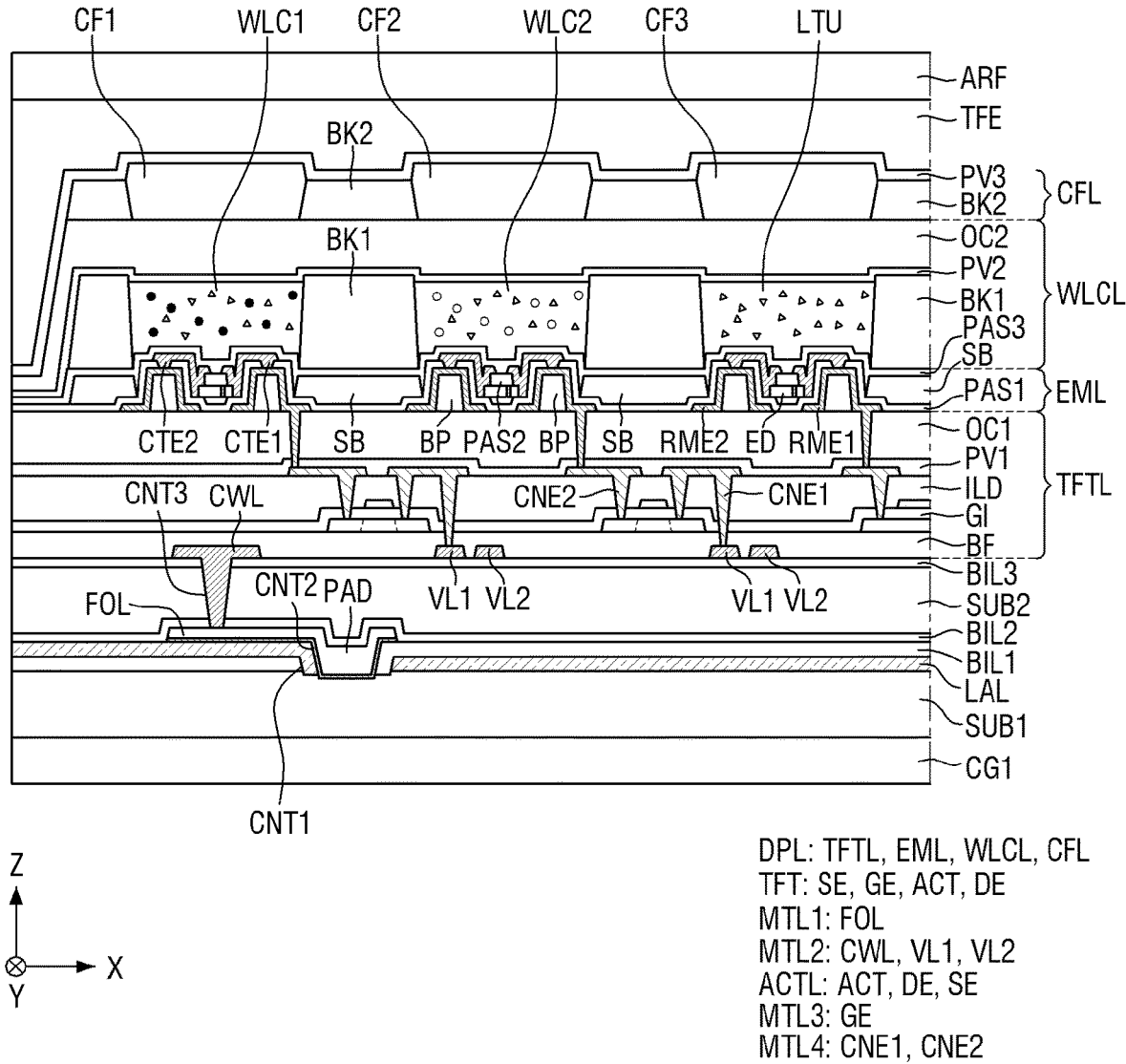

Referring to FIG. 22, the display layer DPL may be stacked on the third barrier insulating layer BIL3. A thin-film transistor layer TFTL, a light emitting element layer EML, a wavelength conversion layer WLCL, and a color filter layer CFL may be stacked on each other on the third barrier insulating layer BIL3. An encapsulation layer TFE may cover upper and side surfaces of the display layer DPL. An anti-reflection layer ARF may be formed on the encapsulation layer TFE.

Figure 23:
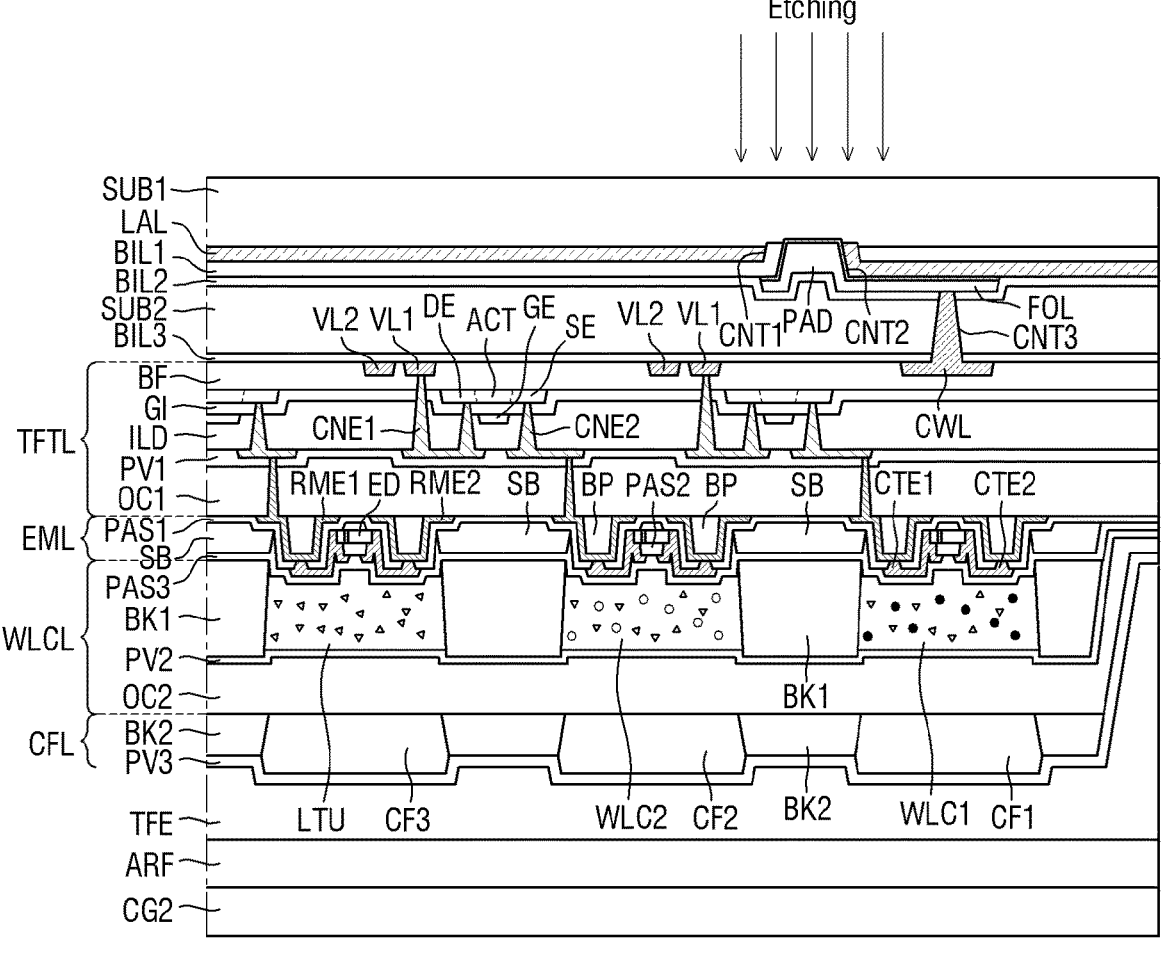
Figure 23:
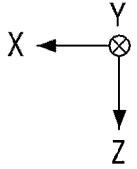
Figure 24:
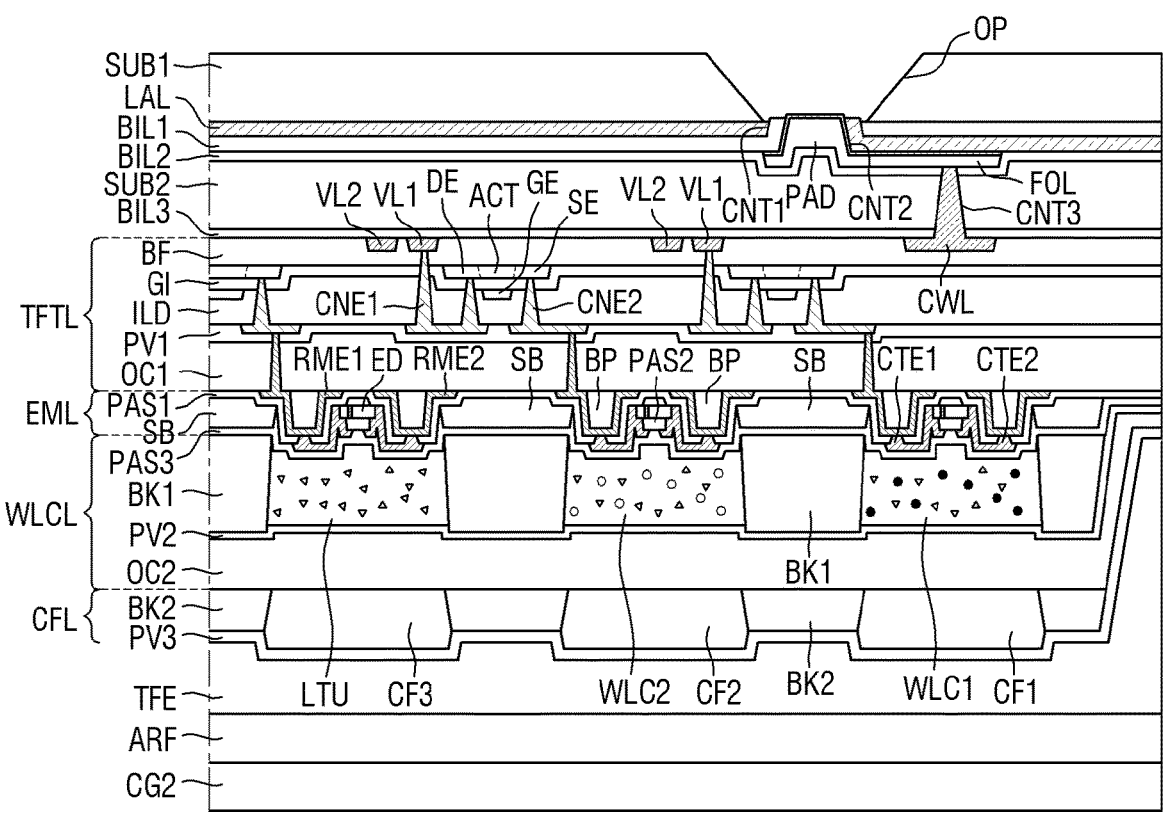
Figure 24:
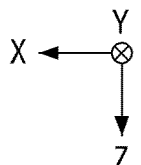

Referring to FIGS. 23 and 24, the display device 10 being manufactured may be inverted vertically to attach a flexible film FPCB. The first carrier substrate CG1 may be removed from the first substrate SUB1. For example, the first carrier substrate CG1 may be removed from a lower surface of the first substrate SUB1 using a sacrificial layer (not illustrated) disposed between the first carrier substrate CG1 and the first substrate SUB1. However, the disclosure is not limited thereto.

A second carrier substrate CG2 may be disposed on a surface of the anti-reflection layer ARF. The second carrier substrate CG2 may support the vertically inverted display device 10. For example, the second carrier substrate CG2 may be, but is not limited to, a carrier glass.

A laser etching process may be performed on a surface of the first substrate SUB1. In an embodiment, UV laser light may have a wavelength of about 300 nm to about 400 nm, in another embodiment about 340 nm to about 350 nm. The opening hole OP may be formed in the first substrate SUB1 to expose a portion of the laser absorption layer LAL and the pad portions PAD. The laser absorption layer LAL and the pad portions PAD may prevent transmission of the UV laser light by absorbing the UV laser light in the etching process of the first substrate SUB1. The pad portions PAD may be partially disposed in the first contact holes CNT1 of the laser absorption layer LAL. However, since a maximum width of each pad portion PAD is greater than a width of each first contact hole CNT1 of the laser absorption layer LAL, the pad portions PAD and the laser absorption layer LAL may overlap each other in the thickness direction. Accordingly, the laser light irradiated to the first substrate SUB1 may be absorbed by the laser absorption layer LAL and the pad portions PAD and thus may be unable to pass through at least the second barrier insulating layer BIL2. The laser absorption layer LAL and the pad portions PAD may prevent damage to the second substrate SUB2 or the display layer DPL by absorbing the UV laser light in the etching process of the first substrate SUB1.

In the laser irradiation process, a portion of the laser absorption layer LAL including amorphous silicon may be crystallized to include polysilicon. However, the laser absorption layer LAL including the polysilicon may be electrically insulated from the pad portions PAD by the first barrier insulating layer BIL1, and electrical failure that may occur between adjacent pad portions PAD may be prevented.

Figure 25:
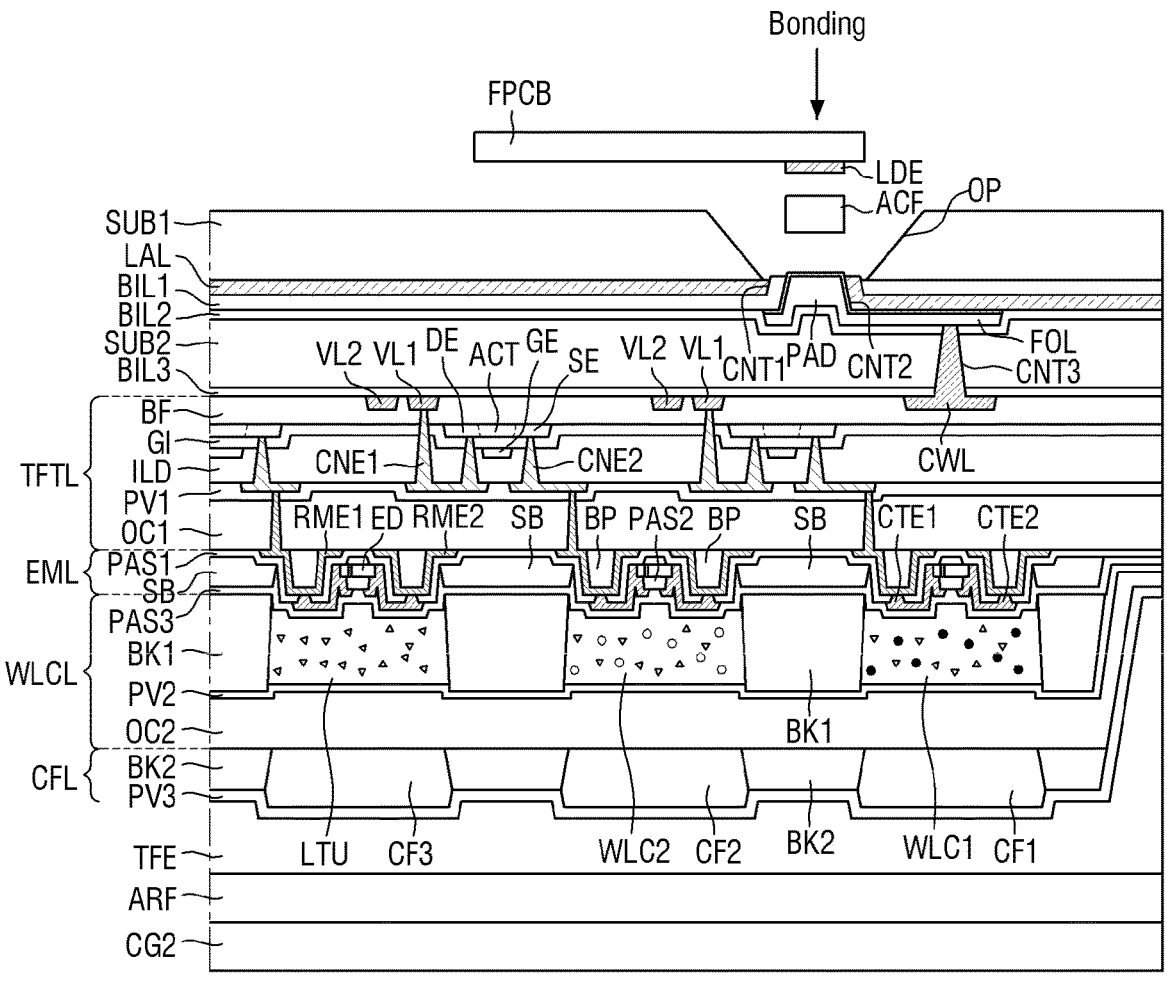
Figure 25:
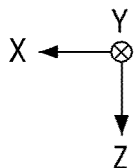
Figure 26:
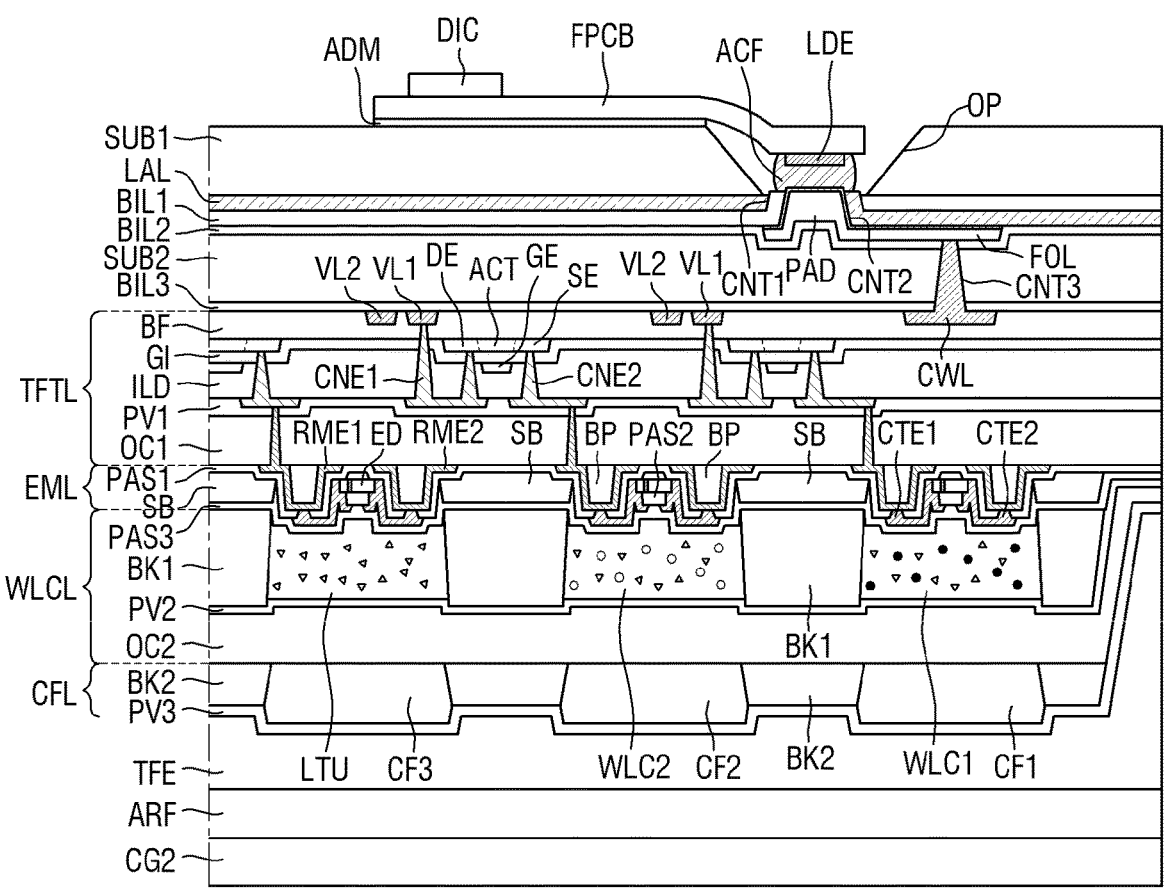
Figure 26:
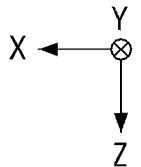

In FIGS. 25 and 26, the flexible film FPCB may be placed on the surface of the first substrate SUB1. The flexible film FPCB and a lead electrode LDE may be aligned on each pad portion PAD through an alignment process. For example, the lead electrode LDE of the flexible film FPCB may be attached to each pad portion PAD through ultrasonic bonding or thermocompression bonding. However, the bonding method is not limited thereto. A connection film ACF may have conductivity in an area where the pad portion PAD and the lead electrode LDE contact each other and may electrically connect the flexible film FPCB to each pad portion PAD.

Other embodiments of the display device 10 will now be described with reference to other drawings.

Figure 27:
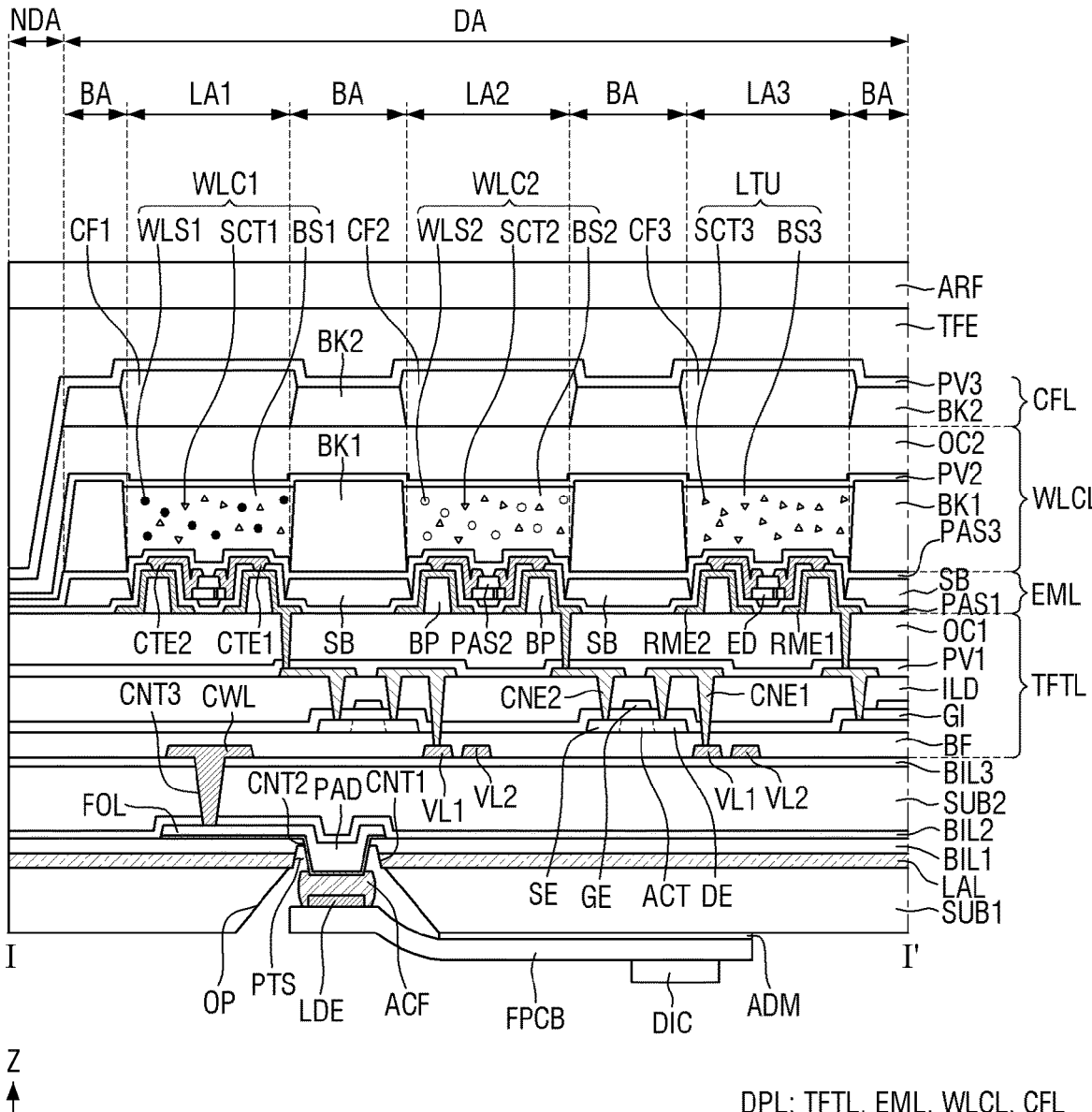
FIG. 27 is a schematic cross-sectional view of a portion of a display device according to an embodiment.
Figure 28:
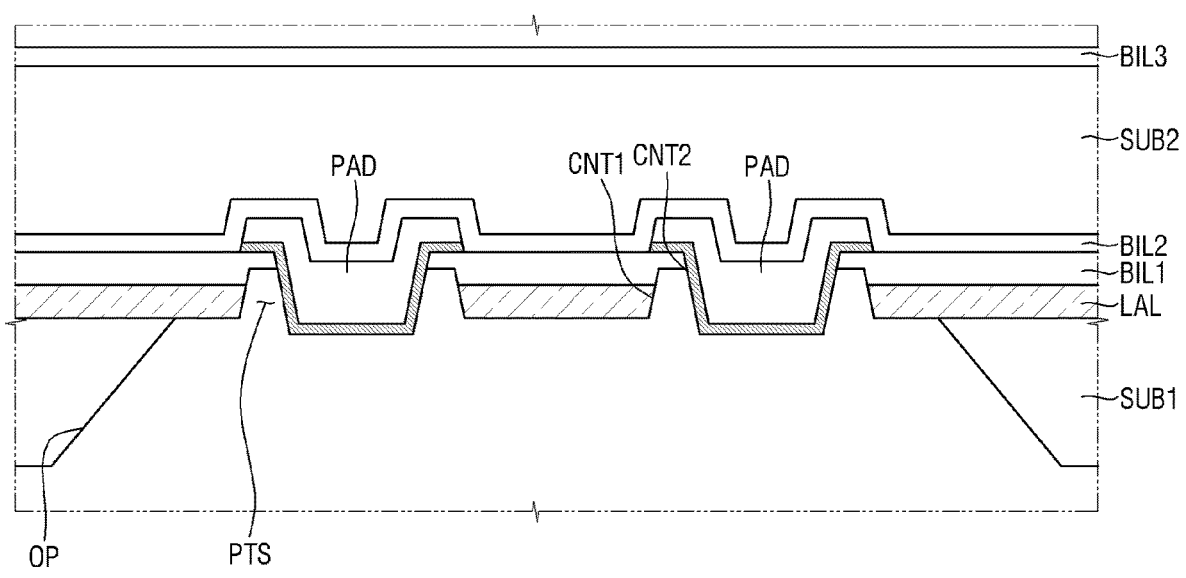
FIG. 28 is a schematic cross-sectional view illustrating the arrangement of pad portions on a bottom surface of the display device of FIG. 27.

FIG. 27 is a schematic cross-sectional view of a portion of a display device 10 according to an embodiment. FIG. 28 is a schematic cross-sectional view illustrating the arrangement of pad portions PAD on a bottom surface of the display device 10 of FIG. 27. FIG. 28 is a cross-sectional view of the display device 10, illustrating a stacked structure from a first substrate SUB1 to a third barrier insulating layer BIL3.

Referring to FIGS. 27 and 28, in the display device 10 according to an embodiment, the pad portions PAD may be spaced apart from a laser absorption layer LAL and not electrically connected to the laser absorption layer LAL, but a first barrier insulating layer BIL1 may not be disposed in first contact holes CNT1 of the laser absorption layer LAL. The first barrier insulating layer BIL1 may include a pattern portion PTS formed by removing a portion of the first barrier insulating layer BIL1 around each pad portion PAD so that the first barrier insulating layer BIL1 is spaced apart from the pad portions PAD. Unlike second contact holes CNT2, the pattern portions PTS of the first barrier insulating layer BIL1 may not penetrate the first barrier insulating layer BILL. In the display device 10, a process of forming the pattern portions PTS of the first barrier insulating layer BIL1 may be performed after a process of forming an opening hole OP of the first substrate SUB1. In the process of forming the pattern portions PTS, a portion of the laser absorption layer LAL which contacts the pad portions PAD may be removed.

Unlike in the display device 10 of FIGS. 5 through 8, in the display device 10 according to a current embodiment, the first barrier insulating layer BIL1 may not be disposed in the first contact holes CNT1 of the laser absorption layer LAL. The first barrier insulating layer BIL1 and the laser absorption layer LAL may be etched in the same process and penetrated by the same contact hole. Accordingly, the first barrier insulating layer BIL1 may not be disposed in contact holes of the laser absorption layer LAL. The pad portions PAD may be placed in contact holes penetrating the first barrier insulating layer BIL1 and the laser absorption layer LAL, and a portion of each of the pad portions PAD may contact the laser absorption layer LAL.

As described above, in a laser process for forming the opening hole OP of the first substrate SUB1, a portion of the laser absorption layer LAL may be crystallized to include polysilicon, and the laser absorption layer LAL which contacts the pad portions PAD may be electrically connected to the pad portions PAD. To prevent this, in the display device 10, a patterning process for partially removing the laser absorption layer LAL and the first barrier insulating layer BIL1 along the periphery of each pad portion PAD may be performed after the process of forming the opening hole OP of the first substrate SUB1. In this process, the laser absorption layer LAL may be partially removed to increase a width of each first contact hole CNT1 and to separate the laser absorption layer LAL from the pad portions PAD, and the first barrier insulating layer BIL1 may be partially etched to form the pattern portions PTS. In the display device 10 according to a current embodiment, the first barrier insulating layer BIL1 does not electrically insulate the laser absorption layer LAL from the pad portions PAD. However, the pad portions PAD and the laser absorption layer LAL may be spaced apart from each other, and electrical failure between adjacent pad portions PAD due to the crystallized laser absorption layer LAL may be prevented.

A display device according to an embodiment may include pad portions and a laser absorption layer to prevent damage to a display layer that may occur during a laser irradiation process. The display device may have a structure in which the pad portions and the laser absorption layer are electrically insulated from each other even if electrical properties of the laser absorption layer are changed by laser light. Accordingly, in the display device, electrical failure that may occur between adjacent pad portions due to the laser absorption layer may be prevented.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A display device, comprising:
a first substrate comprising an opening hole;
a laser absorption layer disposed on the first substrate, the laser absorption layer comprising:
amorphous silicon; and
a plurality of first contact holes;
a first barrier insulating layer disposed on the laser absorption layer and comprising a plurality of second contact holes overlapping the plurality of first contact holes;
a plurality of pad portions disposed on the first barrier insulating layer and partially disposed in the plurality of second contact holes;
a second barrier insulating layer disposed on the first barrier insulating layer and the plurality of pad portions;
a display layer disposed on the second barrier insulating layer; and
a flexible film disposed under the first substrate, inserted into the opening hole, and electrically connected to the plurality of pad portions, wherein
a portion of the first barrier insulating layer is disposed in each of the plurality of first contact holes, and
the plurality of pad portions are electrically insulated from the laser absorption layer.
2. The display device of claim 1, wherein the plurality of pad portions do not directly contact the laser absorption layer.

3. The display device of claim 1, wherein the portion of the first barrier insulating layer which is disposed in each of the plurality of first contact holes partially protrudes from a lower surface of the laser absorption layer.

4. The display device of claim 1, wherein each of the plurality of pad portions comprises a body portion disposed in a corresponding one of the plurality of second contact holes of the first barrier insulating layer and an extension portion disposed on both sides of the body portion and on the first barrier insulating layer, and at least a portion of the laser absorption layer overlaps each of the plurality of pad portions.

5. The display device of claim 4, wherein a width of each of the plurality of first contact holes of the laser absorption layer is smaller than a maximum width of each of the plurality of pad portions and greater than a width of a lower end of the body portion of each of the plurality of pad portions.

6. The display device of claim 5, wherein the width of each of the plurality of first contact holes of the laser absorption layer is in the range of about 15 μm to about 21 μm.

7. The display device of claim 1, wherein a thickness of the laser absorption layer is in the range of about 300 Å to about 1000 Å.

8. The display device of claim 7, wherein the thickness of the laser absorption layer is less than a thickness of the first barrier insulating layer.

9. The display device of claim 1, wherein the laser absorption layer has a transmittance of about 10% or less for light having a wavelength in a range of about 300 nm to about 400 nm.

10. The display device of claim 1, wherein a portion of the laser absorption layer is crystallized to comprise polysilicon.

11. The display device of claim 1, further comprising:

a second substrate disposed between the second barrier insulating layer and the display layer, and a third barrier insulating layer disposed between the second substrate and the display layer, wherein the display layer comprises:

a plurality of connection portions disposed on the third barrier insulating layer and electrically connected to the plurality of pad portions;

a plurality of data lines disposed on the third barrier insulating layer and extending in a first direction; and a plurality of high potential lines disposed on the third barrier insulating layer and extending in the first direction.

12. The display device of claim 11, wherein the plurality of pad portions supply data voltages to the data lines through the connection portions and supply high potential voltages to the high potential lines through the connection portions.

13. The display device of claim 11, wherein the display layer further comprises:

a buffer layer disposed on the connection portions;

thin-film transistors, each comprising an active layer disposed on the buffer layer; and a connection electrode disposed on the active layer, an end of the connection electrode is electrically connected to each of the high potential lines, and another end of the connection electrode is electrically connected to each of the thin-film transistors.

14. The display device of claim 13, wherein the display layer further comprises a light emitting element layer disposed on the connection electrode, and the light emitting element layer comprises:

a first electrode electrically connected to the connection electrode;

a second electrode, the second electrode and the first electrode disposed on a same layer, and a light emitting element disposed on the first electrode and the second electrode and electrically connected to the first electrode and the second electrode.

15. A method of manufacturing a display device, the method comprising:

forming a laser absorption layer which comprises amorphous silicon, on a first substrate;

forming a plurality of first contact holes penetrating the laser absorption layer;

forming a first barrier insulating layer on the laser absorption layer;

forming a plurality of second contact holes penetrating the first barrier insulating layer and overlapping the plurality of first contact holes;

forming a plurality of pad portions disposed on the first barrier insulating layer and inserted into the plurality of second contact holes;

forming a second barrier insulating layer on the first barrier insulating layer and the plurality of pad portions;

forming a display layer on the second barrier insulating layer;

forming an opening hole by etching the first substrate and exposing the plurality of pad portions and a portion of the laser absorption layer; and electrically connecting a flexible film to each of the plurality of pad portions by inserting the flexible film into the opening hole, wherein a portion of the first barrier insulating layer is disposed in each of the plurality of first contact holes, and the plurality of pad portions are electrically insulated from the laser absorption layer.

16. The method of claim 15, wherein the exposing of the portion of the laser absorption layer and the plurality of pad portions comprises irradiating laser light having a wavelength in a range of about 300 nm to about 400 nm to the first substrate, and a portion of the laser absorption layer is crystallized to comprise polysilicon.

17. The method of claim 16, wherein the plurality of pad portions do not directly contact the laser absorption layer.

18. The method of claim 15, wherein the portion of the first barrier insulating layer which is disposed in each of the plurality of first contact holes partially protrudes from a lower surface of the laser absorption layer.

19. The method of claim 18, wherein each of the plurality of pad portions comprises a body portion disposed in a corresponding one of the plurality of second contact holes of the first barrier insulating layer and an extension portion disposed on both sides of the body portion and on the first barrier insulating layer, and at least a portion of the laser absorption layer overlaps each of the plurality of pad portions.

20. A tiled display device, comprising:

a plurality of display devices, each comprising:

a display area having a plurality of pixels; and a non-display area surrounding the display area; and a coupling member coupling the plurality of display devices, wherein at least one of the plurality of display devices comprises:

a substrate comprising an opening hole;

a laser absorption layer disposed on the substrate, comprising:
amorphous silicon; and
a plurality of first contact holes;

a first barrier insulating layer disposed on the laser absorption layer and comprising a plurality of second contact holes overlapping the plurality of first contact holes;

a plurality of pad portions disposed on the first barrier insulating layer and partially disposed in the plurality of second contact holes;

a second barrier insulating layer disposed on the first barrier insulating layer and the plurality of pad portions;

a display layer disposed on the second barrier insulating layer; and a flexible film disposed under the substrate, inserted into the opening hole, and electrically connected to the plurality of pad portions, wherein a portion of the first barrier insulating layer is disposed in each of the plurality of first contact holes, and the plurality of pad portions are electrically insulated from the laser absorption layer.

\* \* \* \* \*